(12) United States Patent
Nemoto

(10) Patent No.: US 7,728,409 B2
(45) Date of Patent: Jun. 1, 2010

(54) SEMICONDUCTOR DEVICE AND METHOD OF MANUFACTURING THE SAME

(75) Inventor: Michio Nemoto, Matsumoto (JP)

(73) Assignee: Fuji Electric Device Technology Co., Ltd., Tokyo (JP)

( * ) Notice: Subject to any disclaimer, the term of this patent is extended or adjusted under 35 U.S.C. 154(b) by 49 days.

(21) Appl. No.: 11/594,975

(22) Filed: Nov. 9, 2006

(65) Prior Publication Data
US 2007/0108558 A1 May 17, 2007

(30) Foreign Application Priority Data
Nov. 10, 2005 (JP) .............................. 2005-326560

(51) Int. Cl.
*H01L 30/00* (2006.01)

(52) U.S. Cl. .................... 257/656; 257/458; 257/657

(58) Field of Classification Search ......... 257/655–657, 257/458
See application file for complete search history.

(56) References Cited

U.S. PATENT DOCUMENTS 6,410,950 B1   6/2002  Sittig et al.

6,441,408 B2   8/2002  Porst et al.
2004/0041225 A1*  3/2004  Nemoto ...................... 257/458
2005/0059263 A1   3/2005  Nakazawa et al.

FOREIGN PATENT DOCUMENTS

| JP | 11-026779 | 1/1999 |
|----|-----------|--------|
| JP | 2000-223720 | 8/2000 |
| JP | 2002-520885 | 7/2002 |
| JP | 2003-318412 | 11/2003 |
| JP | 2005-064429 | 3/2005 |
| JP | 2005-223301 | 8/2005 |

* cited by examiner

*Primary Examiner*—Cuong Q Nguyen
*Assistant Examiner*—Trang Q Tran
(74) *Attorney, Agent, or Firm*—Rabin & Berdo, PC

(57) ABSTRACT

A semiconductor device formed by decreasing thickness of a substrate by grinding, and performing ion implantation. In a diode in which a P anode layer and an anode electrode are formed at a side of a right face of an $N^-$ drift layer, and an $N^+$ cathode layer and a cathode electrode are formed at a side of a back face of the $N^-$ drift layer, an N cathode buffer layer is formed thick compared with the $N^+$-type cathode layer between the $N^-$-type drift layer and the $N^+$ cathode layer, the buffer layer being high in concentration compared with the $N^-$ drift layer, and low compared with the $N^+$ cathode layer. When a reverse bias voltage is applied, a depletion layer is stopped in the middle of the N cathode buffer layer, and thus prevented from reaching the $N^+$ cathode layer, so that the leakage current is suppressed.

9 Claims, 18 Drawing Sheets

SEMICONDUCTOR DEVICE AND METHOD OF MANUFACTURING THE SAME

BACKGROUND OF THE INVENTION

1. Field of the Invention

The present invention relates to a semiconductor device decreased in thickness by a backgrinding process of a semiconductor substrate, and a method of manufacturing the device.

2. Description of Related Art

As a method of manufacturing a power semiconductor device such as a diode or an insulated gate bipolar transistor (hereinafter, referred to as IGBT), the following method is known. First, a semiconductor device is manufactured using a wafer such as silicon wafer while it has a large thickness. Then, the wafer is decreased in thickness to have a final thickness by grinding and etching, and then subjected to ion implantation and activation heat treatment (for example, refer to JP-T-2002-520885, where the term "JP-T" as used herein means a published Japanese translation of a PCT patent application). Such a manufacturing method is becoming mainstream in recent years.

However, in this manufacturing method, since an electrode has already been formed on a surface of the wafer at a side opposite to a side of a surface that was ground, heat treatment must be performed at low temperature, at or below a melting point of the material of the electrodes, for example, at a temperature of 450° C. or less if the electrode material is aluminum, in the activation heat treatment after grinding. Therefore, it is hard to sufficiently activate impurities.

Thus, the applicant has proposed a method of activating an ion-implanted impurity by irradiating high-energy laser light such as YAG second harmonic (YAG2ω) upon an ion implantation surface instead of heat treatment in this manufacturing method (for example, refer to JP-A-2005-223301 and JP-A-2005-64429). According to this method, since energy can be applied only to a region in an appropriate depth from a laser irradiation surface, the impurity can be activated without adversely affecting the previously formed electrode.

For example, a diode in a withstand voltage class of 1200 V is fabricated as follows. First, a P-type anode layer or an aluminum electrode to be an anode electrode is formed on a right face of an N-type FZ (floating zone) silicon wafer having a thickness of about 500 μm and resistivity of about 60 Ωcm. Then, the wafer is subjected to grinding from a back face, so that the thickness of the wafer is made to be 140 μm. Then, the ground surface is chemically polished by wet etching using nitro-hydrofluoric acid. Then, phosphorous is ion-implanted into the polished surface.

Then, such an ion-implanted surface is irradiated with YAG 2ω laser light by a double pulse method setting an energy density of 4 J/cm² and a delay time of 300 nanoseconds, so that the phosphorous is electrically activated, thereby forming an N⁺ cathode layer. Here, the double pulse method is a method where a plurality of pulse laser beams are continuously irradiated from a plurality of laser irradiation devices with irradiation timing being staggered by predetermined delay times for each irradiation area of laser light. The double pulse method is described in detail in the JP-A-2005-223301.

Moreover, a diode in which an impurity concentration of a drift layer has a profile that the concentration gradually decreases from the neighborhood of the center of the drift layer to the anode and cathode layers, and an IGBT in which the impurity concentration of a drift layer has a profile such that the concentration gradually decreases from the neighborhood of the center of the drift layer to emitter and collector layers are known (for example, refer to JP-A-2005-64429 and JP-A-2003-318412). A diode or IGBT having such an impurity concentration profile has properties of both a high-speed and low-dissipation and exhibits a soft recovery property.

Furthermore, a semiconductor element is known, in which a P-type anode layer is formed at one end of an N-type semiconductor substrate in low concentration, and an N-type cathode layer in comparatively high concentration is formed at the other end; an i layer is formed between the anode and cathode layers; and an N-type impurity layer in low concentration compared with the cathode layer is provided between the cathode layer and the i layer (for example, refer to JP-A-2000-223720). Moreover, a power diode is known, in which an N-type internal region, and an N-type cathode region following the internal region and having high doping concentration compared with the internal region, and a P-type anode region following the internal region and having high doping concentration compared with the internal region are provided, and an N-type floating region having high doping concentration compared with the internal region is provided in the internal region (for example, refer to JP-A-11-26779).

However, such a diode or IGBT, which is fabricated by the method in which one surface of a semiconductor substrate is ground, and a cathode layer of the diode or a collector layer of the IGBT is formed on such a ground surface, exhibits a problem in that the probability of defective articles is high in measurement of electric characteristics in a wafer state before being cut into individual chips, that is, production yield is low. For example, when a leakage current of an element at a reverse bias voltage of 1200 V of a diode (hereinafter, referred to as reverse leakage current) was measured in the wafer state, many elements showed a leakage current of 10 μA/cm² or more with respect to a criterion of 1 μA/cm² or less, and the production yield was 60% or less.

The problem of generation of such a reverse leakage current has not been noticed in the past. Therefore, it should be appreciated that the patent references referred to above do not suppose generation of the reverse leakage current at all. Therefore, there is no description of the reverse leakage current or description of a measure for the reverse leakage current therein.

It is desirable to provide a semiconductor device showing a small reverse leakage current, the device being fabricated by decreasing the thickness of a semiconductor substrate by grinding, then performing ion implantation to such a ground surface and thermal activation of an implanted element. Moreover, it is desirable to provide a method of manufacturing a semiconductor device, in which a semiconductor device showing a small reverse leakage current is fabricated by decreasing thickness of a semiconductor substrate by grinding, then performing ion implantation to such a ground surface and thermal activation of an implanted element.

As a result of earnest study, the inventor discovered the following. When a scratch is formed on a ground surface (ion implantation surface) of a semiconductor substrate, or a particle caused by grinding remains thereon, since phosphorous as an N-type impurity is not normally ion-implanted into the ground surface, a cathode layer in high concentration may not be uniformly formed.

That is, when the particle remains, the particle blocks the phosphor, and the phosphor is not sufficiently implanted into the substrate, therefore a cathode layer in high concentration is not formed. Moreover, when a scratch having a size of a trajectory of an ion or more is formed on an implanted surface after ion implantation, an N⁺ high-concentration layer is not formed in a portion of the scratch and therefore an exposed portion of the substrate is formed. When a high reverse bias voltage is applied to an element having such a defect, a depletion layer expands into an N⁻ drift layer, and reaches an electrode at the site of the defect, therefore the reverse leakage current is increased. The present invention overcomes these problems.

SUMMARY OF THE INVENTION (1) A semiconductor device according to one embodiment of the invention includes a first semiconductor layer of a first conduction type; a second semiconductor layer of a second conduction type, which is high in concentration compared with the first semiconductor layer and provided in contact with the first semiconductor layer at a side of one main surface of the first semiconductor layer; a third semiconductor layer of the first conduction type, which is high in concentration compared with the first semiconductor layer and provided at a side of the other main surface of the first semiconductor layer; a fourth semiconductor layer of the first conduction type, which is high in concentration compared with the first semiconductor layer and low in concentration compared with the third semiconductor layer, and provided in contact with both the first semiconductor layer and the third semiconductor layer between the first semiconductor layer and the third semiconductor layer; a first electrode electrically connected to the second semiconductor layer; and a second electrode electrically connected to the third semiconductor layer; wherein the thickness of the fourth semiconductor layer in a direction from the one main surface to the other main surface of the first semiconductor layer is large compared with thickness of the third semiconductor layer in the same direction.

(2) A semiconductor device according to a further embodiment of the invention includes a first semiconductor layer of a first conduction type including an FZ semiconductor substrate; a second semiconductor layer of a second conduction type, which is high in concentration compared with the first semiconductor layer and provided in contact with the first semiconductor layer at a side of one main surface of the first semiconductor layer; a third semiconductor layer of the first conduction type formed in a surface by a diffusion process, the surface being formed by decreasing thickness of the other main surface of the first semiconductor layer by grinding; and a fourth semiconductor layer of the first conduction type; the third semiconductor layer being high in concentration compared with the first semiconductor layer, and the forth semiconductor layer being situated between the first semiconductor layer and the third semiconductor layer, and high in concentration compared with the first semiconductor layer and low in concentration compared with the third semiconductor layer; and the semiconductor device further includes a first electrode electrically connected to the second semiconductor layer; and a second electrode electrically connected to the third semiconductor layer; wherein the thickness of the fourth semiconductor layer in a direction from the one main surface to the other main surface of the first semiconductor layer is large compared with the thickness of the third semiconductor layer in the same direction.

(3) A semiconductor device according to yet another embodiment of the invention includes a fourth semiconductor layer of a first conduction type including an FZ semiconductor substrate or a CZ semiconductor substrate; a first semiconductor layer of the first conduction type, which is low in concentration compared with the fourth semiconductor layer and formed at a side of one main surface of the fourth semiconductor layer by epitaxial growth; a second semiconductor layer of a second conduction type, which is high in concentration compared with the first semiconductor layer and provided in contact with the first semiconductor layer at a side of one main surface of the first semiconductor layer; a third semiconductor layer of the first conduction type formed in a surface by a diffusion process, the surface being formed by decreasing thickness of the other main surface of the fourth semiconductor layer; the third semiconductor layer being high in concentration compared with the fourth semiconductor layer, and the forth semiconductor layer being situated between the first semiconductor layer and the third semiconductor layer; and the semiconductor device further includes a first electrode electrically connected to the second semiconductor layer; and a second electrode electrically connected to the third semiconductor layer; wherein the thickness of the fourth semiconductor layer in a direction from the one main surface to the other main surface of the first semiconductor layer -is large compared with the thickness of the third semiconductor layer in the same direction.

(4) In the semiconductor device according to any one of (1) to (3), the concentration of the fourth semiconductor layer is $1 \times 10^{14}$ atoms/cc or more and $1 \times 10^{15}$ atoms/cc or less.

(5) In the semiconductor device according to any one of (1) to (4), the thickness of the fourth semiconductor layer in the direction from the one main surface to the other main surface of the first semiconductor layer is 0.1 µm or more.

According to (1) to (5), when a withstand voltage to be a maximum voltage is applied as the reverse bias voltage, the depletion layer is expanded into the first semiconductor layer, and reaches the fourth semiconductor layer, however, since it is stopped in the middle of the fourth semiconductor layer, it does not reach the third semiconductor layer. Therefore, leakage current is suppressed.

(6) A method of manufacturing a semiconductor device according to a preferred embodiment of the invention, which is a method of manufacturing the semiconductor device according to (3), includes a step of using a semiconductor substrate of a first conduction type having a structure where the first semiconductor layer of the first conduction type is stacked on the fourth semiconductor layer of the first conduction type, and having a concentration of an element of the first conduction type in the fourth semiconductor layer being in solid solubility less than a solid solubility limit of a semiconductor material constituting the fourth semiconductor layer, and forming the second semiconductor layer of the second conduction type on a surface layer of the first semiconductor layer; a step of forming the first electrode contacting the second semiconductor layer; a step of grinding a surface layer of the fourth semiconductor layer to make the semiconductor substrate have a desired thickness with the fourth semiconductor layer being exposed; a step of forming the third semiconductor layer of the first conduction type on a surface layer of a surface exposed by grinding the fourth semiconductor layer; and a step of forming the second electrode contacting the third semiconductor layer.

(7) A method of manufacturing a semiconductor device according to another preferred embodiment of the invention, which is a method of manufacturing the semiconductor device according to (2), includes a step of using a semiconductor substrate of the first conduction type, the substrate being the first semiconductor layer of the first conduction type, and having a concentration of an element of the first conduction type in the first semiconductor layer being in solid solubility less than a solid solubility limit of a semiconductor material constituting the first semiconductor layer, and forming the second semiconductor layer of the second conduction type on a surface layer of a right face of the first semiconductor layer; a step of grinding a surface layer of a back face of the first semiconductor layer to make the semiconductor substrate have a desired thickness with the first semiconductor layer being exposed; a step of forming the fourth semiconductor layer of the first conduction type on a surface layer of a surface exposed by grinding the first semiconductor layer; a step of forming the first electrode contacting the second semiconductor layer; a step of forming the third semiconductor layer of the first conduction type shallow compared with the fourth semiconductor layer on a surface layer of a surface exposed by grinding the first semiconductor layer; and a step of forming the second electrode contacted to the third semiconductor layer.

(8) The method of manufacturing the semiconductor device according to (7) further including a step of irradiating protons into the semiconductor substrate to introduce the protons into the first semiconductor layer before the semiconductor substrate is ground and after the second semiconductor layer has been formed.

(9) In the method of manufacturing the semiconductor device according to any one of (6) to (8), in the step of forming the third semiconductor layer, an impurity of the first conduction type is ion-implanted into the surface exposed by the grinding, then laser light is irradiated onto the ion implanted surface, whereby an implanted impurity is electrically activated.

(10) In the method of manufacturing the semiconductor device according to any one of (6) to (9), in the step of grinding the semiconductor substrate, wet etching is performed after the grinding, so that the surface exposed by the grinding is removed in a thickness of 3 µm to 20 µm, whereby stress is removed.

According to (6) to (10), the fourth semiconductor layer is formed between the first and third semiconductor layers. Accordingly, a semiconductor device is obtained, in which the low leakage current is small when the withstand voltage to be the maximum voltage is applied as the reverse bias voltage.

Semiconductor devices according to the embodiments of the invention exhibit an advantage that the reverse leakage current is decreased, the semiconductor device being fabricated by decreasing thickness of a semiconductor substrate by grinding, then performing ion implantation into such a ground surface and thermal activating an implanted element. Moreover, according to the method of manufacturing the semiconductor device according to an embodiment of the invention, the advantage is exhibited that a semiconductor device showing a small reverse leakage current can be fabricated by decreasing thickness of a semiconductor substrate by grinding, then performing ion implantation into such a ground surface and thermal activating an implanted element.

DESCRIPTION OF THE PREFERRED EMBODIMENT

Hereinafter, preferred embodiments of a semiconductor device and a method of manufacturing the device according to an embodiment of the invention will be described in detail with reference to accompanied drawings. In the specification and the accompanied drawings, a layer or a region prefixed with N or P means that electrons or holes are majority carriers therein, respectively. Moreover, + and − added to the N means that impurity concentration is relatively high or low, respectively. In the following description of the embodiments and accompanied drawings, the same configurations are marked with the same references, and overlapped description is omitted.

Embodiment 1

Figure 1:
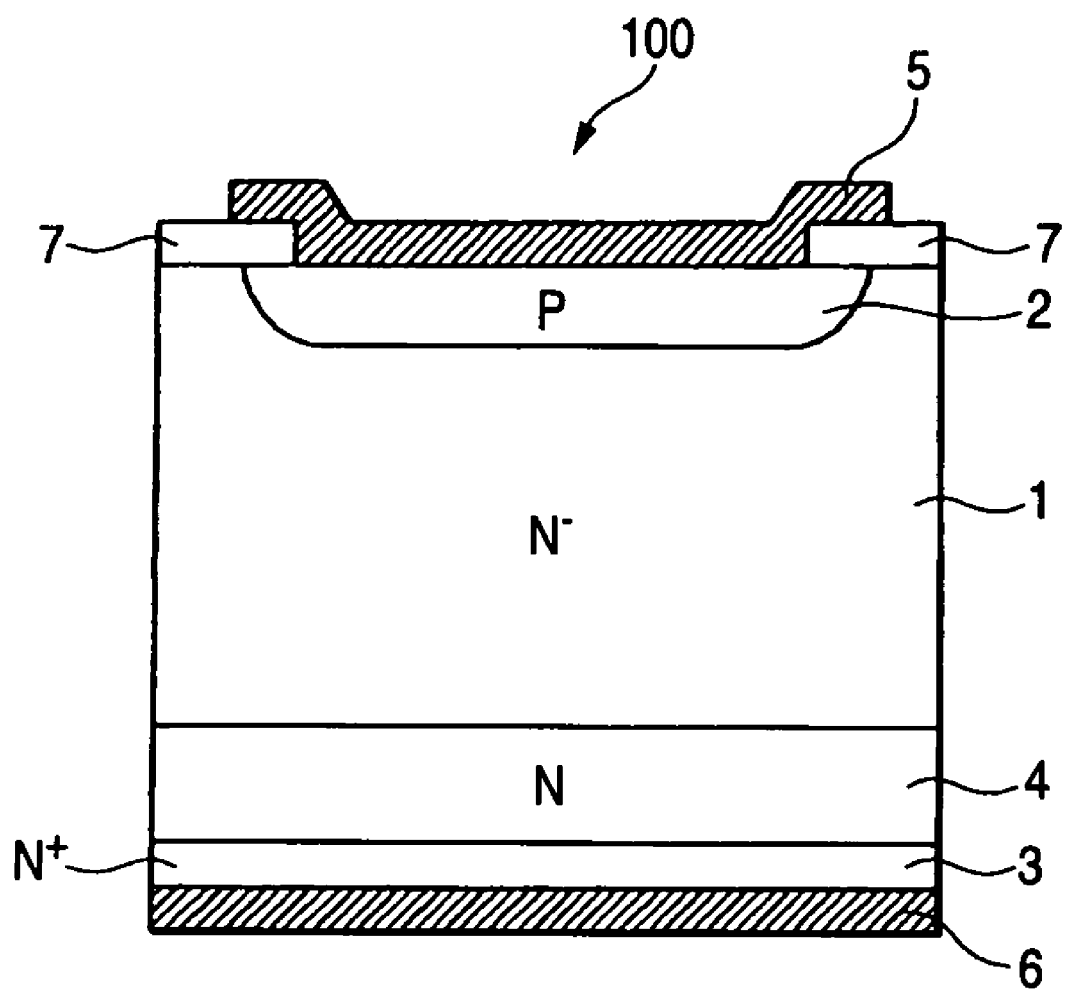
FIG. 1 shows a cross section view of a semiconductor device according to embodiment 1.

FIG. 1 shows a cross section view showing a configuration of a semiconductor device according to embodiment 1 of the invention. As shown in FIG. 1, the semiconductor device of the embodiment 1 is, for example, a diode 100 having an N⁻ drift layer 1 as a first semiconductor layer, a P anode layer 2 as a second semiconductor layer, N+ cathode layer 3 as a third semiconductor layer, an N cathode buffer layer 4 as a fourth semiconductor layer, an anode electrode 5 as a first electrode, and a cathode electrode 6 as a second electrode.

The P anode layer 2 is provided in contact with the N− drift layer 1 at a side of one main surface of the N− drift layer 1. The N+ cathode layer 3 is provided at a side of the other main surface of the N− drift layer 1. The N cathode buffer layer 4 is provided between the N− drift layer 1 and the N+ cathode layer 3, and contacted to both the N− drift layer 1 and the N+ cathode layer 3.

That is, the semiconductor device is in a structure where the N+ cathode layer 3, N cathode buffer layer 4, N− drift layer 1, and P anode layer 2 are stacked in this order. Both the P anode layer 2 and the N+ cathode layer 3 have high impurity concentration compared with the N− drift layer 1. Impurity concentration of the N cathode buffer layer 4 is high compared with the N− drift layer 1, and low compared with the N+ cathode layer 3.

Concentration of an element showing the N type in the N− drift layer 1 and the N cathode buffer layer 4 has solid solubility less than a solid solubility limit of a semiconductor material of the N− drift layer 1 and the N cathode buffer layer 4, for example, silicon. For example, concentration of the element in the N cathode buffer layer 4 is appropriately $1 \times 10^{14}$ atoms/cc to $1 \times 10^{15}$ atoms/cc.

Thickness of the N cathode buffer layer 4 in a direction from the one main surface to the other main surface of the N− drift layer 1 is large compared with thickness of the N+ cathode layer 3 in the same direction. For example, thickness of the N cathode buffer layer 4 is appropriately 0.1 μm or more. Desirably, the thickness of the N cathode buffer layer 4 is 10 μm or more.

The anode electrode 5 is provided in contact with a surface of the P anode layer 2, and electrically connected to the P anode layer 2. The anode electrode 5 is isolated from the N− drift layer 1 by an insulating film 7. The cathode electrode 6 is provided in contact with a surface of the N+ cathode layer 3, and electrically connected to the N+ cathode layer 3.

Figure 2:
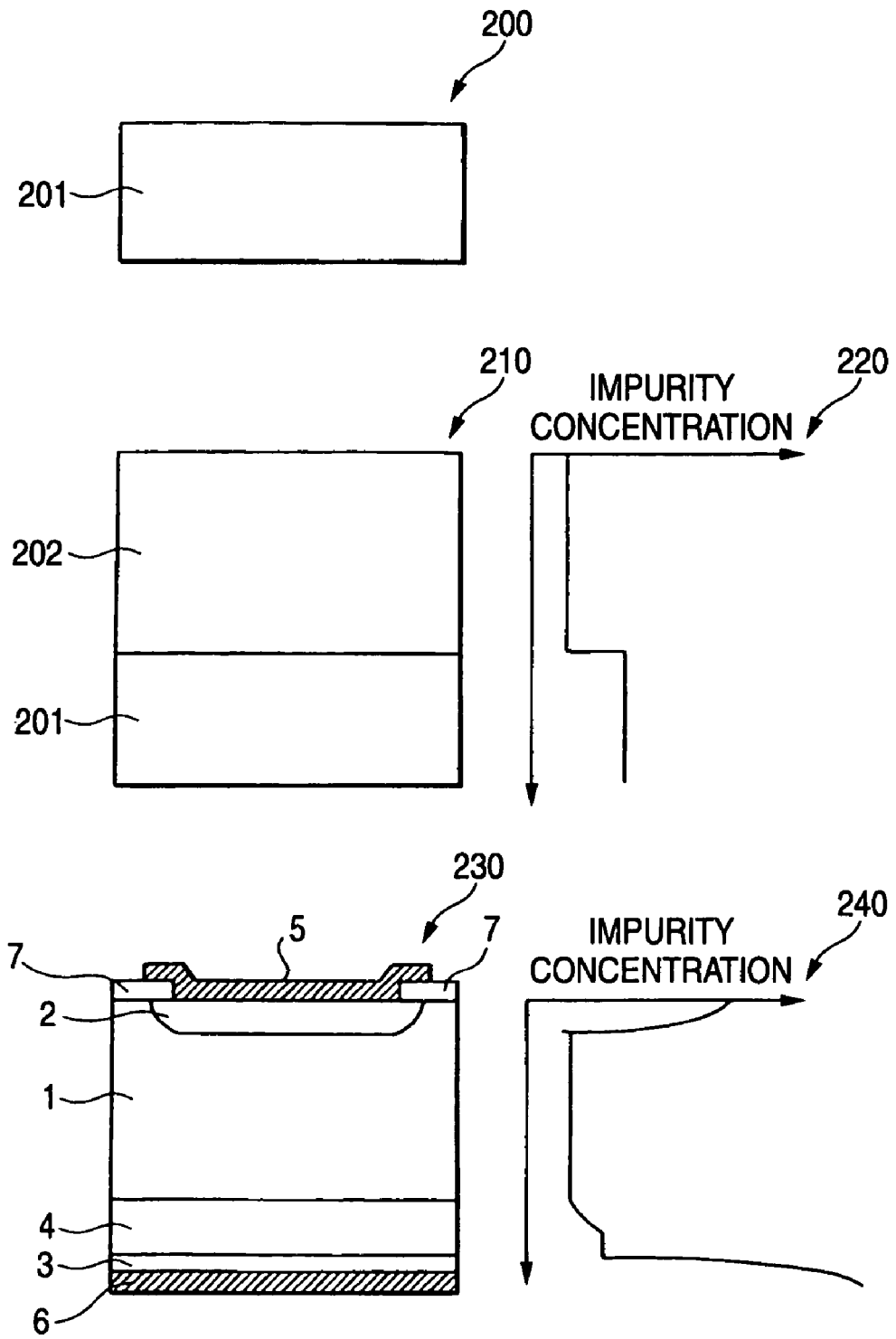
FIG. 2 shows a relevant-part section view of a manufacturing process of the semiconductor device according to embodiment 1.

Next, a method of manufacturing the diode according to the embodiment 1 is described. FIG. 2 shows a relevant-part section view showing a manufacturing process of the diode 100 according to the embodiment 1. Here, a case where the diode is fabricated in setting a chip size of 10 mm×10 mm such that it has a withstand voltage class of a 1200 V and a rated current of 150 A is described as an example. The chip size can be variously changed depending on the settings of the withstand voltage and the rated current.

First, as shown by reference 200 in FIG. 2, an N-type FZ or CZ wafer 201, for example, 5 ins. in diameter is prepared as a starting wafer, the wafer having a concentration of contained phosphorous of $5 \times 10^{14}$ atoms/cc and resistivity of 9.1 Ωcm. The N-type FZ or CZ wafer 201 is to be the N cathode buffer layer 4 of the diode 100. While only the FZ wafer is described below, the CZ wafer is also acceptable.

Next, as shown by a reference 210, an N-type epitaxial layer 202 is grown on a surface side of the N-type FZ wafer 201, the epitaxial layer having a phosphorous concentration of $8.0 \times 10^{13}$ atoms/cc and resistivity of 57 Ωcm. The N-type epitaxial layer 202 is to be the N− drift layer 1 of the diode 100. This epitaxial wafer is used for a semiconductor substrate. A reference 220 indicates a profile of impurity concentration of the semiconductor substrate.

Next, as shown by a reference 230, steps of a typical diode process are performed, so that a P anode layer 2 having an impurity concentration of $5 \times 10^{16}$ atoms/cc and a depth of 3 μm, and a not-shown guard ring edge structure are formed on a surface of the N− drift layer 1 (N-type epitaxial layer 202). Furthermore, the insulating film 7 is provided on a surface of the P anode layer 2, then a contact hole is opened in the insulating film 7, and then the anode electrode 5 to be in ohmic contact with the P anode layer 2 is formed by, for example, Al-1% Si.

Then, the semiconductor substrate is irradiated with an electron beam at an acceleration voltage of 4.8 MeV and a dose of 180 kGy, and then subjected to heat treatment for 1 hr at 357° C. Then, an exposed surface of the N-type FZ wafer 201, that is, a surface at a side where the N-type epitaxial layer 202 is not stacked is subjected to grinding, so that total thickness is reduced to 160 μm. Then, such a ground surface is subjected to wet etching using nitro-hydrofluoric acid, so that final thickness of 140 μm is given. The wet etching removes stress due to the grinding.

Thickness of the N− drift layer 1 and thickness of the N cathode buffer layer 4 in this stage are 120 μm and 20 μm respectively. In the grinding and polishing steps, it is necessary that the N cathode buffer layer 4 is remained with having desired thickness after polishing. While the ground surface was removed by thickness of 20 μm here, thickness to be removed is appropriately about 3 to 20 μm.

Next, a surface layer of the N cathode buffer layer 4, which is exposed after polishing, is ion-implanted with phosphorous at an acceleration voltage of 45 keV and in a dose amount of $1 \times 10^{15}$ atoms/cm². Then, such an ion-implanted surface is irradiated with YAG second harmonic laser light by a double pulse method. At that time, energy density of the laser light is set to be, for example, 4 J/cm² in total for each irradiation area of the laser light, and delay time between double pulses is set to be, for example, 300 nanoseconds.

This laser irradiation activates the phosphorous implanted into the surface layer of the N cathode buffer layer 4, so that an N+ cathode layer 3 is formed. Finally, metals are deposited on a surface of the N+ cathode layer 3 in order of Ti, Ni and Au, so that a cathode electrode 6 to be in ohmic contact with the N+ cathode layer 3 is formed, consequently the diode 100 is completed. A reference 240 indicates a profile of impurity concentration of the completed diode 100.

Figure 3:
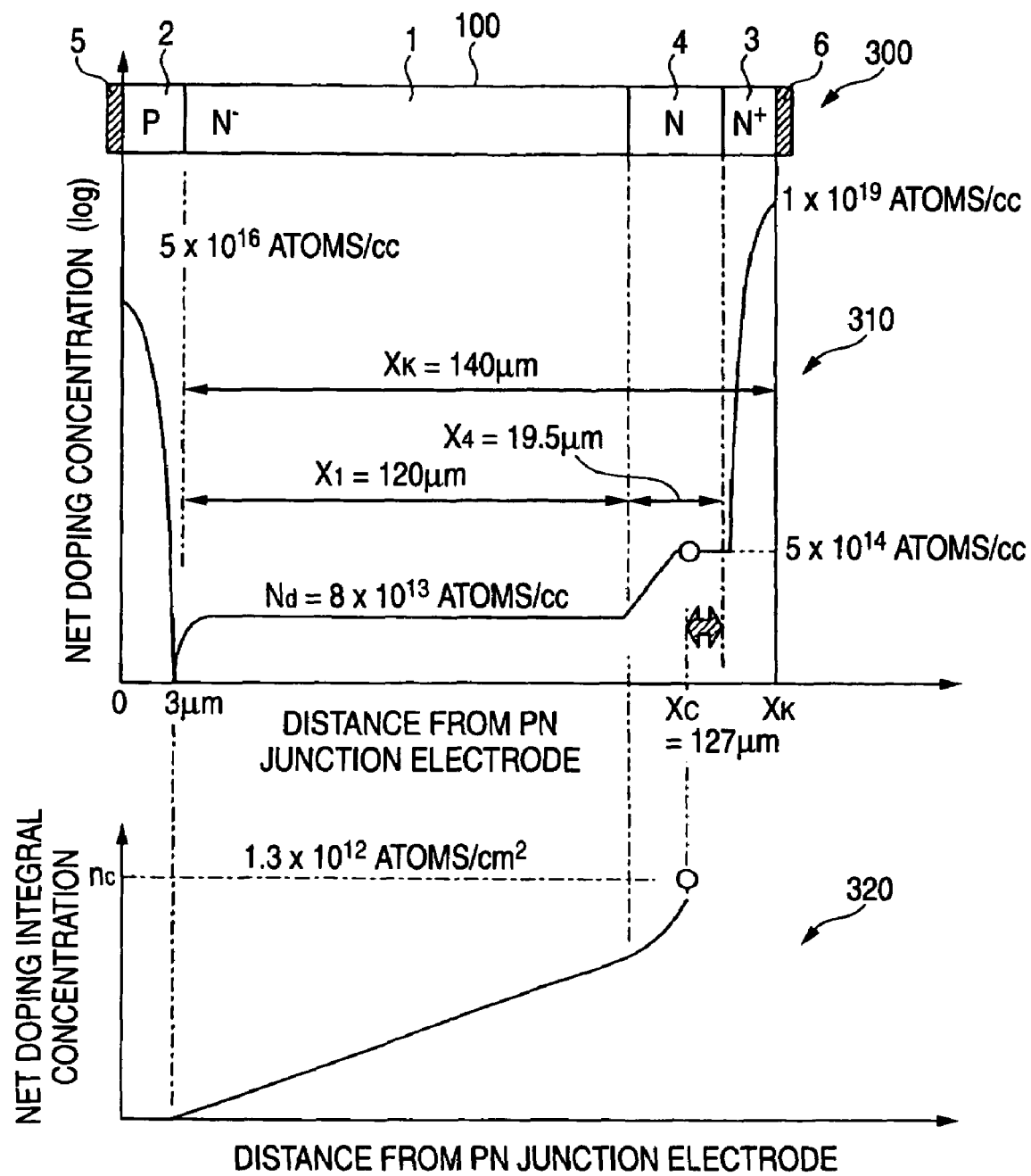
FIG. 3 shows an explanatory view of doping concentration of the semiconductor device according to embodiment 1.

Next, the size and doping concentration of each portion of the diode according to embodiment 1 are described. FIG. 3 shows an explanatory view showing an example of size and doping concentration of a diode fabricated by the manufacturing process. FIG. 3 shows a relevant-part section view 300 of the diode, distribution diagram 310 of net doping concentration, and distribution diagram 320 of net doping integral concentration. The net doping integral concentration is an integral of net doping concentration of the N− drift layer 1 and the N cathode buffer layer 4 from a PN junction between the P anode layer 2 and the N− drift layer 1 to the N+ cathode layer 3. Horizontal axes of the distribution diagrams 310 and 320 correspond to the relevant-part section view 300 of the diode.

As shown in FIG. 3, using the PN junction between the P anode layer 2 and the N− drift layer 1 as a reference, when it is assumed that a distance to an interface between the N− drift layer 1 and the N cathode buffer layer 4 is $X_1$, and a distance to an interface between the N+ cathode layer 3 and the cathode electrode 6 is $X_k$, $X_1$ and $X_k$ are, for example, 120 μm and 140 μm respectively. When it is assumed that a distance between the N− drift layer 1 and the N+ cathode layer 3 is $X_4$, $X_4$ is, for example, 19.5 μm.

When a reverse bias voltage is applied between an anode and a cathode, and critical integral concentration is assumed to be $n_c$ in the case that the reverse bias voltage corresponds to a withstand voltage value of an element, $n_c$ is expressed by the following formula from the Poisson's formula. However, $\in_s$ is a dielectric constant of a semiconductor, q is elementary charge, and $E_c$ is dielectric breakdown field strength of the semiconductor.

$$n_c = \epsilon_s \cdot E_c / q$$

As shown in the distribution diagram 320 of net doping integral concentration, thickness and concentration (distribution) of the N cathode buffer layer 4 are adjusted such that the net doping integral concentration corresponds to $n_c$ in the N cathode buffer layer 4. A value of $E_c$ is about $3 \times 10^5$ V/cm in silicon, about $3 \times 10^6$ V/cm in SiC, about $5 \times 10^6$ V/cm in diamond, and about $3 \times 10^6$ V/cm in GaN.

When the diode 100 is formed using a silicon semiconductor, a value of $n_c$ is about $1.3 \times 10^{12}$ atoms/cc. Therefore, thickness and concentration (distribution) of the N cathode buffer layer 4 are adjusted such that the net doping integral concentration is about $1.3 \times 10^{12}$ atoms/cc in the middle of the N cathode buffer layer 4.

Here, in the case of a manufacturing process that a semiconductor substrate is ground thin to have a thickness of about 100 μm, then the N⁺ cathode layer 3 and the cathode electrode 6 are formed on such a ground surface, it is important to prevent impurities or defects from affecting a characteristic of an element. To this end, it is enough that when a withstand voltage to be a maximum voltage is applied to the element as a reverse bias voltage, a region that is not sufficiently depleted, that is, a neutral region remains at a side of the N⁻ drift layer 1 rather than a side of the N⁺ cathode layer 3 so that a depletion layer does not reach the N⁺ cathode layer 3.

The thickness of the N⁺ cathode layer 3 formed by the manufacturing process is 1 μm or less from a surface of the N⁺ cathode layer 3, which is as small as less than 1/100 of the total thickness of the substrate. In the case of a process of forming such a thin layer by ion implantation of an impurity and activation treatment of the impurity, for example, implantation of the impurity may be obstructed by a particle adhered to an ion implantation surface during ion implantation, or the ion implantation surface may be scratched during electrode formation or wafer carrying, thereby a portion where the N⁺ cathode layer 3 is not fully formed tends to be produced.

When the N⁺ cathode layer 3 has such an imperfect portion, the concentration of the N⁺ cathode layer 3 is decreased. Therefore, in the case of an element without having the N cathode buffer layer 4, when a reverse bias voltage as high as about withstand voltage is applied to the element, the N⁺ cathode layer 3 cannot stop expansion of the depletion layer, consequently the depletion layer reaches the cathode electrode 6. Therefore, a reverse leakage current is increased, leading to reduction in production yield of a device.

On the contrary, in the case of the embodiment 1, the N cathode buffer layer 4 exists, and the integral value of the impurity concentration from the N⁻ type drift layer 1 to the N cathode buffer layer 4 reaches the critical integral concentration $n_c$ in the middle of the N cathode buffer layer 4, as described before. Therefore, while depletion is expanded to a position at which the integral value of the impurity concentration reaches the critical integral concentration $n_c$ at the withstand voltage, a region from the position to the N⁺ cathode layer 3 (region shown by a thick arrow in the distribution diagram 310 of net doping concentration of FIG. 3) is not depleted, and becomes a neutral region. That is, since the N cathode buffer layer 4 can stop expansion of the depletion layer at an anode side at a certain distance from the N⁺ cathode layer 3, the depletion layer can be prevented from reaching the N⁺ cathode layer 3.

Figure 4:
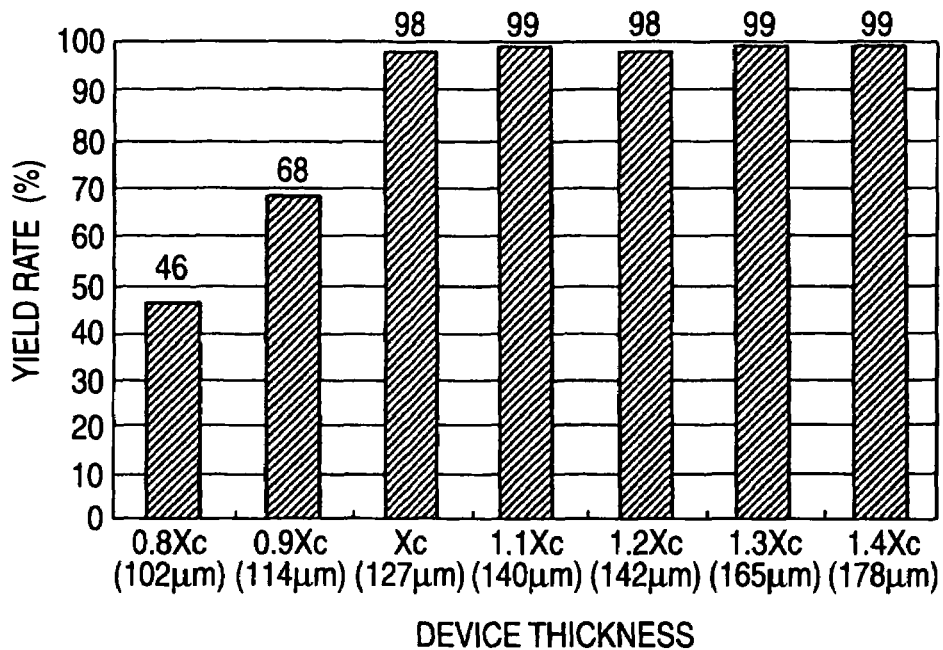
FIG. 4 shows a characteristic view of a relationship between a yield rate and final device thickness of the semiconductor device according to embodiment 1.

Next, the thickness of the diode according to the embodiment 1 is described. FIG. 4 shows a characteristic view showing a relationship of a yield rate against final device thickness of the diode according to the embodiment 1. In FIG. 4, $X_c$ is a distance from the PN junction surface of the diode 100 to the position at which the integral value of the impurity concentration reaches the critical integral concentration $n_c$, and, for example, 127 μm in the example shown in FIG. 3. The N cathode buffer layer 4 exists in device thicknesses of $X_c$ to $1.4X_c$, but does not exist in device thicknesses of $0.8X_c$ and $0.9X_c$.

In FIG. 4, a reverse bias voltage of 1200 V is applied between the anode electrode 5 and the cathode electrode 6, and a device having a current density of the reverse leakage current of 1 μA/cm² or less is assumed as a good device, and a device having a current density of more than 1 μA/cm² is assumed to be a bad device. From FIG. 4, it is known that when the device thickness is $X_c$ or more, a yield rate is sufficiently high, approximately 99%, however, on the contrary, when the device thickness is less than $X_c$, the yield rate is significantly lower, 46 to 68%.

The result shows that the device is not affected by the dopant blocking during ion implantation or the scratch on the ion implantation surface because of the existence of the N cathode buffer layer 4. If the device thickness is $X_c$ or more, that is, if the N cathode buffer layer 4 exists, a yield rate of 90% or more can be obtained even if the thickness of the buffer layer is, for example, about 1 μm, however, an N cathode buffer layer 4 having a thickness of 10 μm or more is desirably formed.

In the former example as disclosed in the JP-A-2003-318412, the N cathode buffer layer 4 is not formed. Even if the N cathode buffer layer 4 is not formed, if a device has a certain thickness, expansion of the depletion layer can be stopped before the depletion layer reaches the N⁺ cathode layer 3. However, in this case, a difficulty occurs in the loss characteristic of the device.

Thus, next, a result of a comparison between the diode according to embodiment 1 (hereinafter, referred to as the example) and three diodes in a former configuration (hereinafter, referred to as former example 1, former example 2 and former example 3) is described. The example is the diode 100 having a size and concentration as shown in FIG. 3, and the diode of the example is fabricated according to the manufacturing process of FIG. 2. The former example 1 and the former example 2 are diodes in a former configuration as disclosed in the JP-A-2003-318412. The former example 3 is a diode in the former configuration using an FZ wafer, in which phosphorous is diffused in high concentration, as a substrate.

Figure 5:
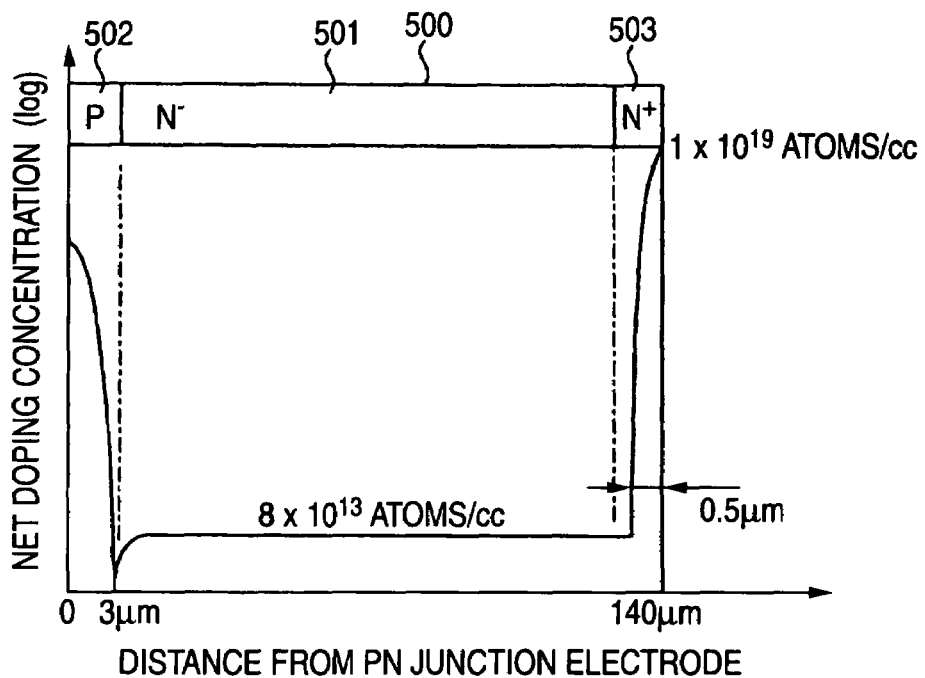
FIG. 5 shows an explanatory view of size and doping concentration of former example 1.

FIG. 5 shows the size and doping concentration of the diode of the former example 1. In FIG. 5, references 500, 501, 502 and 503 indicate the diode of the former example 1, an N⁻ drift layer, a P anode layer, and an N⁺ cathode layer respectively. In the former example 1, an N-type FZ wafer was used as a starting wafer, the wafer having a low concentration compared with the example, and having a concentration of $8 \times 10^{13}$ atoms/cc. The FZ wafer was used for the semiconductor substrate, and subjected to a process of forming a right face of the semiconductor substrate, then subjected to electron beam irradiation and heat treatment, as in the example. Then, a back face of the semiconductor substrate was ground so that substrate thickness of 160 μm was obtained, and then subjected to wet etching using nitro-hydrofluoric acid, consequently a diode 500 having a final thickness of 140 μm was fabricated.

Figure 6:
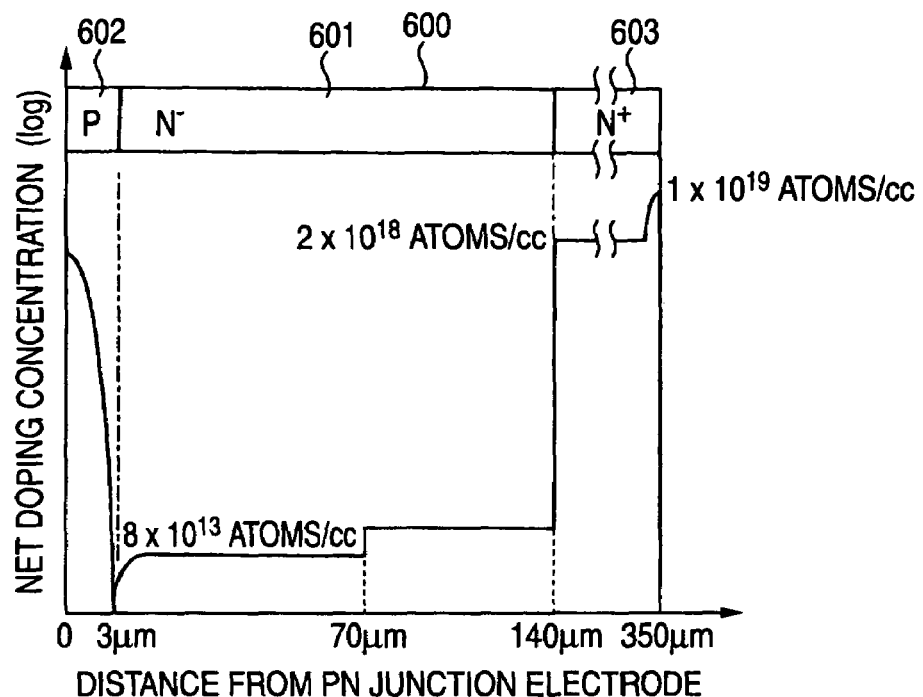
FIG. 6 shows an explanatory view of size and doping concentration of former example 2.

FIG. 6 shows size and doping concentration of the diode of the former example 2. In FIG. 6, references 600, 601, 602 and 603 indicate the diode of the former example 2, an N⁻ drift layer, a P anode layer, and an N⁺ cathode layer respectively. In the former example 2, an N-type CZ (Czochralski) wafer was used as a starting wafer, the wafer containing antimony in concentration up to a solid solution limit of $2\times10^{18}$ atoms/cc or more.

On a right face of the CZ wafer, a first epitaxial layer having a phosphorous concentration of $1.5\times10^{14}$ atoms/cc was grown in a thickness of 70 μm, and furthermore a second epitaxial layer having a phosphorous concentration of $8\times10^{13}$ atoms/cc was grown in a thickness of 70 μm, consequently total thickness of the epitaxial layers of 140 μm was obtained. The epitaxial wafer was used for the semiconductor substrate, and a structure of a right face of the semiconductor substrate was prepared by the same process and the same condition as in the example and the former example 1.

However, before Al-1.0% Si was deposited to be the anode electrode on the right face of the semiconductor substrate, a back face of the substrate was ground to obtain a total thickness of 350 μm. Then, a ground surface was ion-implanted with arsenic in a dose amount of $1.0\times10^{15}$ atoms/cm$^2$, and then subjected to heat treatment for 30 min at 1000° C. This is to reduce contact resistance between the N$^+$-type cathode layer 603 and a not-shown cathode electrode. Finally, metals were deposited in order of Ti, Ni and Au on a surface of the N$^+$ cathode layer 603, thereby a cathode electrode was formed.

The reason the N-type CZ wafer containing antimony or arsenic in concentration of a solid solubility limit has been usually used for the substrate as the former example 2 is as follows. In the diode 600 of the former example 2, a portion of the N-type CZ wafer remains in a thickness of 200 μm or more as the N$^+$ cathode layer 603. Since electrons as majority carriers flow into the N$^+$-type cathode layer 603 in a thickness direction of the layer during current conduction, voltage drop occurs due to a resistance component of the portion.

Since a resistance value is about 0.05 mΩ when a concentration of antimony is $2\times10^{18}$ atoms/cc or more, voltage drop of 10 mV or more occurs at the rated current of 150 A. To decrease the voltage drop to the utmost, a resistance component of the N$^+$ cathode layer 603, that is, the resistance of the CZ wafer needs to be reduced. Therefore, a wafer containing antimony or the like in the concentration of the solid solubility limit has been used in former elements.

Here, regarding the concentration at the solid solubility limit, theoretically, the concentration is unambiguously determined. However, in actual manufacturing, it is not a fixed concentration reflecting variation in process such as temperature during manufacturing, and has a certain range. For example, in the case of the CZ silicon wafer containing antimony, antimony concentration (at room temperature) in an actual substrate has a range of about $5\times10^{17}$ to $2\times10^{18}$ atoms/cc. This is because a segregation coefficient of antimony is extremely lower than 1, 0.023, consequently an antimony concentration distribution in the CZ wafer tends to be nonuniform. Accordingly, the specification defines that the concentration at solid solubility limit (solid solubility) means the concentration of about $5\times10^{17}$ atoms/cc or more, which has a range of about 50%, in a broad sense. Therefore, in the case of an embodiment of the invention, it is desirable that the concentration of the N-type element in the fourth semiconductor layer is primarily low compared with the concentration of the solid solubility limit in the broad sense, and in the case of antimony, it is desirably lower than $5\times10^{17}$ atoms/cc at the maximum.

Figure 7:
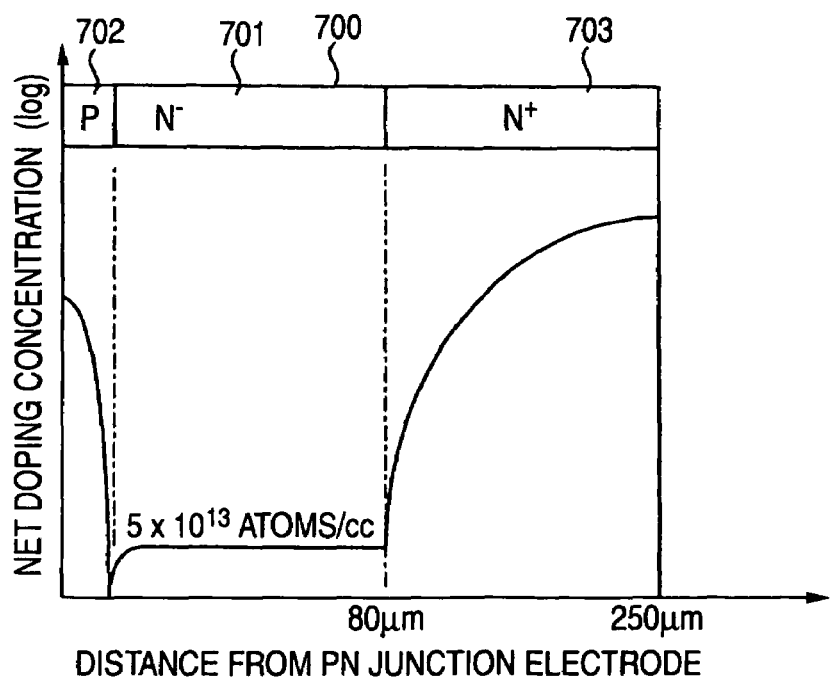
FIG. 7 shows an explanatory view of size and doping concentration of former example 3.

FIG. 7 shows size and doping concentration of the diode of the former example 3. In FIG. 7, references 700, 701, 702 and 703 indicate the diode of the former example 3, an N$^-$ drift layer, a P anode layer, and an N$^+$ cathode layer respectively. In the former example 3, an N-type FZ wafer was used for the semiconductor substrate, the wafer having phosphorous concentration of $5\times10^{13}$ atoms/cc and thickness of 250 μm. Then, phosphorous in high concentration was diffused deep from a back face of the semiconductor substrate at a diffusion condition of 1300° C. and 100 hr. At that time, a surface concentration of phosphorous at a side of the back face of the substrate was about $1\times10^{20}$ atoms/cc, and diffusion depth was 170 μm.

Next, a structure of a right face of the semiconductor substrate was prepared in the same way as in the example and the former example 1. Finally, metals were deposited in order of Ti, Ni and Au on a surface of the N$^+$ cathode layer 703, thereby a not-shown cathode electrode was formed. At that time, in the former example 3, grinding of a back face of the substrate was not performed, and the cathode electrode was formed while keeping thickness of the semiconductor substrate of 250 μm.

In the former example 1, thickness of the wafer is reduced, about 100 μm, in a final stage of a manufacturing process, leading to difficulty in handling, therefore a structure of the former example 2 or former example 3 was typically used. However, the former example 1 being advantageous in switching loss has been often used with improvement in handling technique or processing technique of a thin wafer.

Figure 8:
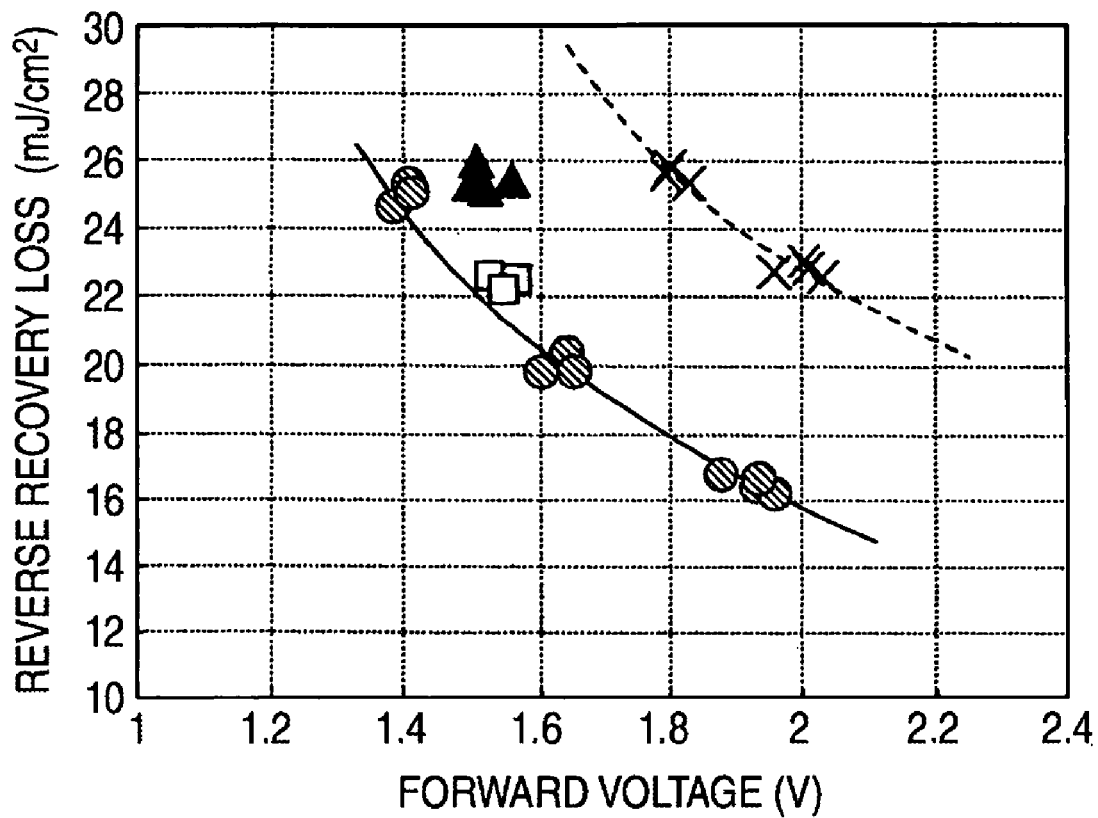
FIG. 8 shows a tradeoff characteristic of reverse recovery loss against forward voltages of an example for the former examples 1 to 3.

FIG. 8 shows a characteristic view showing a tradeoff characteristic of reverse recovery loss against forward voltages of the example and the former examples 1 to 3. As clear from FIG. 8, the example exhibits a far better loss characteristic. Loss in each of the former example 1 and the former example 2 is lower than loss in the former example 3, but about 5 to 10% higher than loss in the example. This is because the example has the N cathode buffer layer 4 having a high concentration compared with the average concentration of the N$^-$ drift layer 1.

Figure 9:
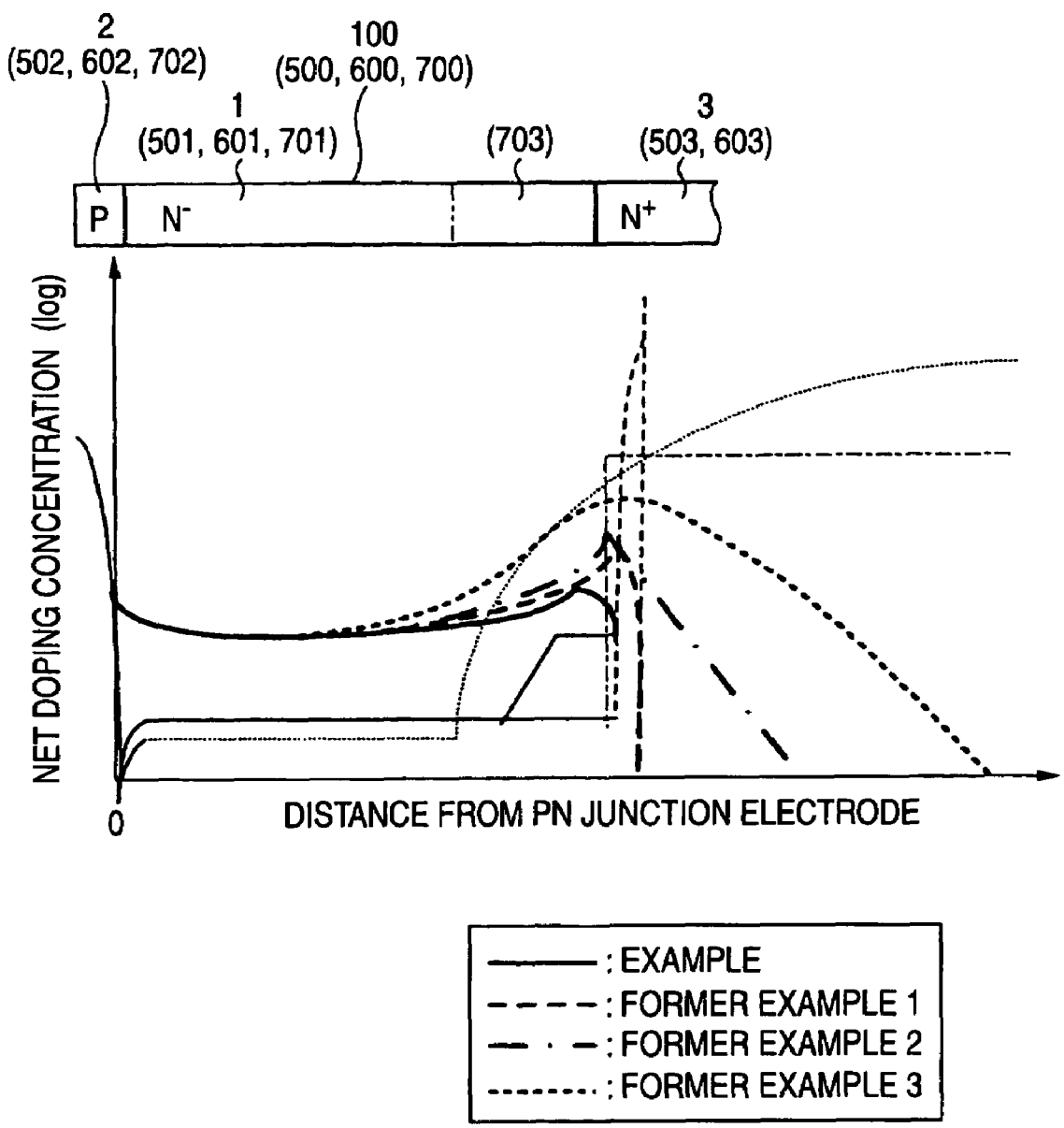
FIG. 9 shows a view showing a simulation result of carrier distribution of the example for the former examples 1 to 3.

FIG. 9 shows a simulation result showing carrier distribution during conduction of the example and the former examples 1 to 3. In FIG. 9, a thick solid line, broken line, dashed line, and dot line show carrier distribution during conduction of the example, carrier distribution during conduction of the former example 1, carrier distribution during conduction of the former example 2, and carrier distribution during conduction of the former example 3, respectively. Moreover, in FIG. 9, a thin solid line, broken line, dashed line, and dotted line correspond to concentration distribution of FIG. 3 of the example, concentration distribution of FIG. 5 of the former example 1, concentration distribution of FIG. 6 of the former example 2, and concentration distribution of FIG. 7 of the former example 3.

As shown in FIG. 9, in the diode 500 of the former example 1, surplus carriers during conduction are modulated by 140 μm corresponding to approximately substrate thickness. On the contrary, in the diode 100 of the example, since a region corresponding to thickness of 20 μm of the N cathode buffer layer 4 (omitted to be shown in the diode 100 in an upper part of FIG. 9) has a high concentration, a modulation region of concentration is substantially only a portion of thickness of 120 μm of the N$^-$ drift layer 1. In this way, the effective thickness of the N$^-$ drift layer 1 is reduced, thereby loss in the example is reduced by about 10% compared with loss in the former example 1.

In the diode 600 of the former example 2, since the N$^+$ cathode layer 603 has a high concentration (about $2\times10^{18}$ atoms/cc), a loss characteristic during conduction or in switching is determined by a portion of a low-concentration epitaxial layer, that is, a portion of thickness of 120 μm of the N$^-$ drift layer 601. However, since a region having surplus carriers remained therein exists in about several ten micrometers from a boundary between the N⁻ drift layer 601 and the N⁺ cathode layer 603 to a not-shown cathode electrode side, loss in the former example 2 is large about 5% compared with loss in the example.

In the diode 700 of the former example 3, reverse recovery loss is large about 44% compared with the example. This is because, as shown in FIG. 9, distribution concentration of a high-concentration diffusion layer, that is, distribution concentration of the N⁺ cathode layer 703 gradually changes compared with each distribution concentration in the example, former example 1 and former example 2, thereby a modulation region of surplus carriers is long about 20% compared with that in each of the example, former example 1 and former example 2.

Figure 10:
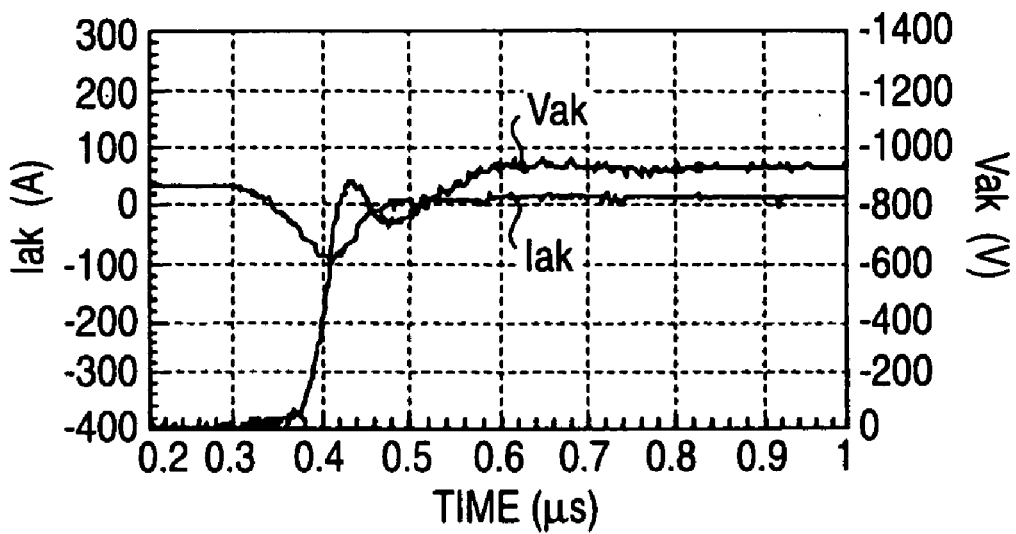
FIG. 10 shows a small-current reverse recovery waveform view of the example.
Figure 11:
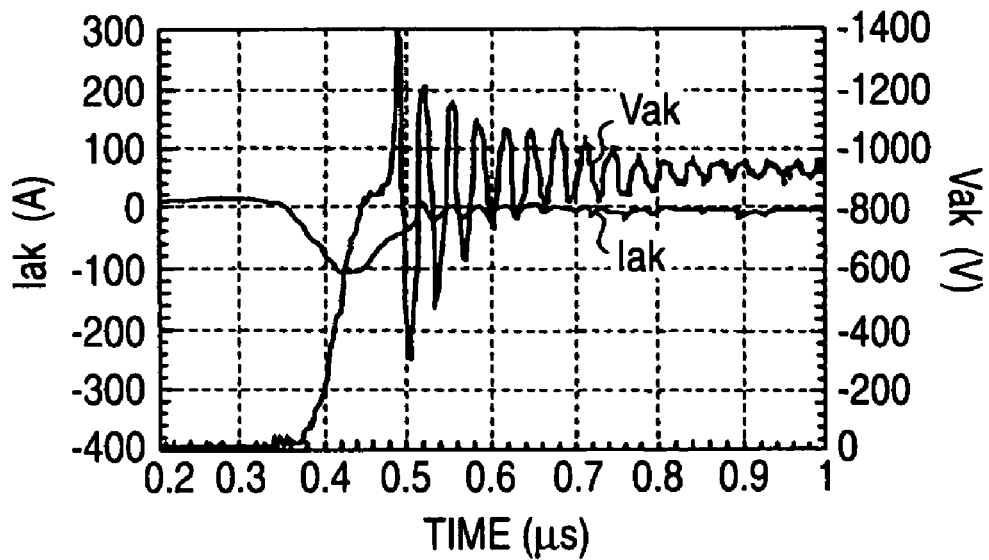
FIG. 11 shows a small-current reverse recovery waveform view of the former example 3.

FIGS. 10 and 11 show waveform diagrams showing minute-current reverse recovery waveforms of the example and the former example 3 respectively. In each case, a breaking current was set to be 20 A that is ¹/₁₀ of a rated current. As shown in FIG. 10, the diode 100 of the example has a DC bus voltage of 900 V (about 75% of the rated voltage of 1200 V) and has a soft recovery characteristic without oscillation.

On the contrary, as shown in FIG. 11, in the diode 700 of the former example 3, oscillation occurs with a steep surge voltage. The reason for such a snappy waveform is that, in the former example 3, a portion of thickness of 80 μm in an anode side has high resistance, and an expansion range of a space-charge region during reverse recovery becomes large about 20% compared with the example, resulting in sweep and depletion of carriers. Minute-current reverse recovery waveforms of the former example 1 and the former example 2 are the same as the waveform of the example.

Figure 12:
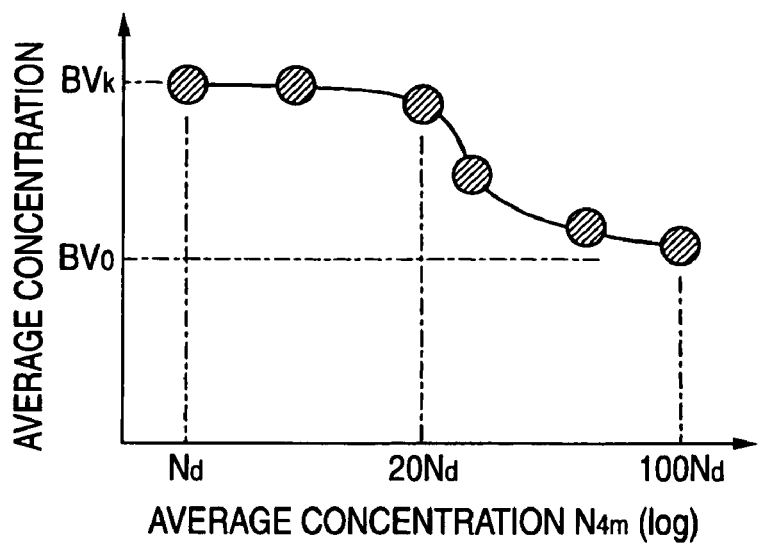
FIG. 12 shows a characteristic view of a withstand voltage to average concentration of a cathode buffer layer of the example.
Figure 13:
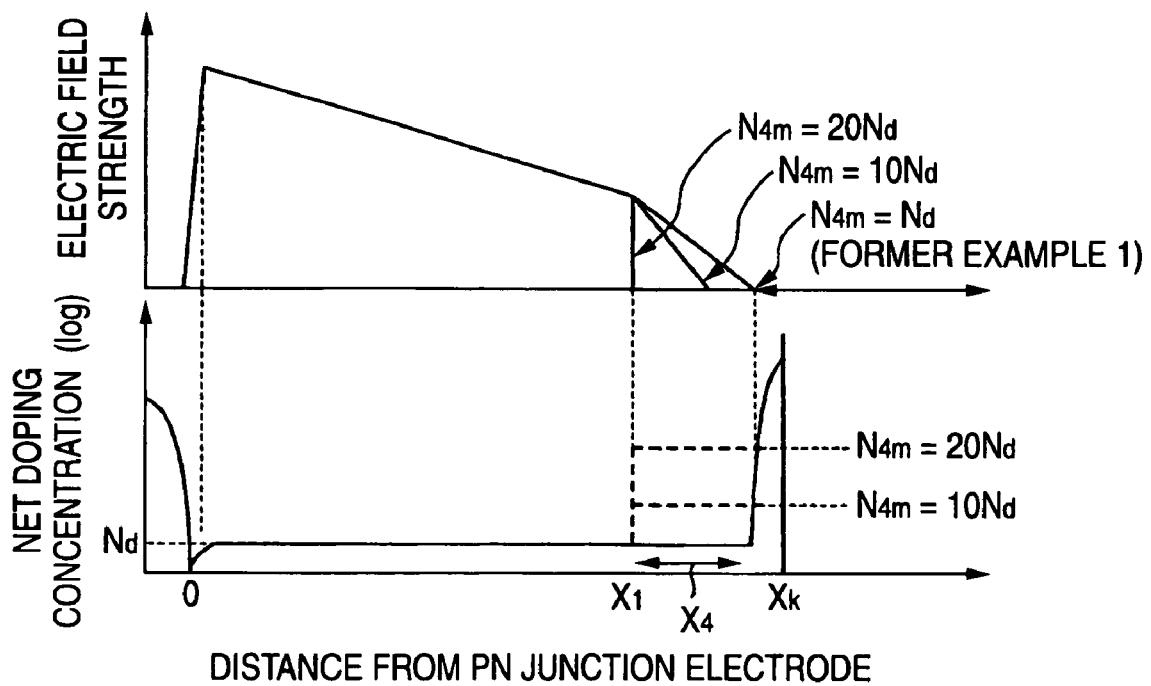
FIG. 13 shows a schematic view of a characteristic of the withstand voltage to the average concentration of the cathode buffer layer of the example.

Next, since concentration of the N cathode buffer layer 4 needs to be carefully adjusted, the concentration of the N cathode buffer layer 4 is described. FIG. 12 shows a characteristic view showing a relationship of a withstand voltage against average concentration of the N cathode buffer layer 4 in the diode 100 of the example, and FIG. 13 shows a schematic view of the characteristic. In FIG. 13, average concentration $N_{4m}$ of a portion of a range $X_4$ of the N cathode buffer layer 4 is changed from $N_d$ (about 8×10¹³ atoms/cc) to 20 $N_d$ (about 1.6×10¹⁵ atoms/cc).

Here, $N_d$ is a value of averaging a value of integrating concentration of the N⁻ drift layer 1 from a PN junction to a distance $X_1$ by the distance $X_1$. In the diode 100 of the example, $N_d$ is the same as the concentration of the N⁻ drift layer 1, 8×10¹³ atoms/cc. In the case that the average concentration $N_{4m}$ of the N cathode buffer layer 4 is the same as that of the drift layer, $N_d$, this case corresponds to the former example 1, and the withstand voltage of the buffer layer is BVk (=1430 V) as shown in FIG. 12.

As the average concentration $N_{4m}$ of the N cathode buffer layer 4 is increased, the withstand voltage is decreased, and when $N_{4m}$ is in 20$N_d$ or more, the withstand voltage is down to BV₀. BV₀ is a withstand voltage value at sufficiently high concentration of the N cathode buffer layer 4, and 1250 V. In a case that the N cathode buffer layer 4 has sufficiently high concentration, the case corresponds to the former example 2. That is, when the concentration of the N cathode buffer layer 4 is 20$N_d$ or more, the withstand voltage is decreased to the same level as in the former example 2. Therefore, the concentration of the N cathode buffer layer 4 is desirably $N_d$ to 20$N_d$.

Next, a process of decreasing thickness of a substrate by grinding of the back face of the substrate is described in detail. First, a back face of a silicon substrate is mechanically ground using an abrasive slurry (backgrind), so that total thickness of about 160 μm is given. Then, one of chemical etching (wet etching), chemical mechanical polishing (CMP), or dry polishing is performed, or an appropriate combination of them is performed, so that a ground surface of the back face of the substrate is removed in thickness of 3 to 20 μm, thereby a stress layer such as grinding strain caused by grinding of the back face of the substrate is removed. In the diode 100 of the example, the ground surface is removed in thickness of 20 μm for removing stress, and finally total thickness of 140 μm is given.

When chemical etching is performed in stress removal, a silicon substrate is held on a rotational stage by adsorption, and etching is performed by dropping a hydrofluoric acid and/or nitric acid base etchant having a controlled etching rate while rotating the silicon substrate. At that time, the etchant is used with being circulated.

Figure 14:
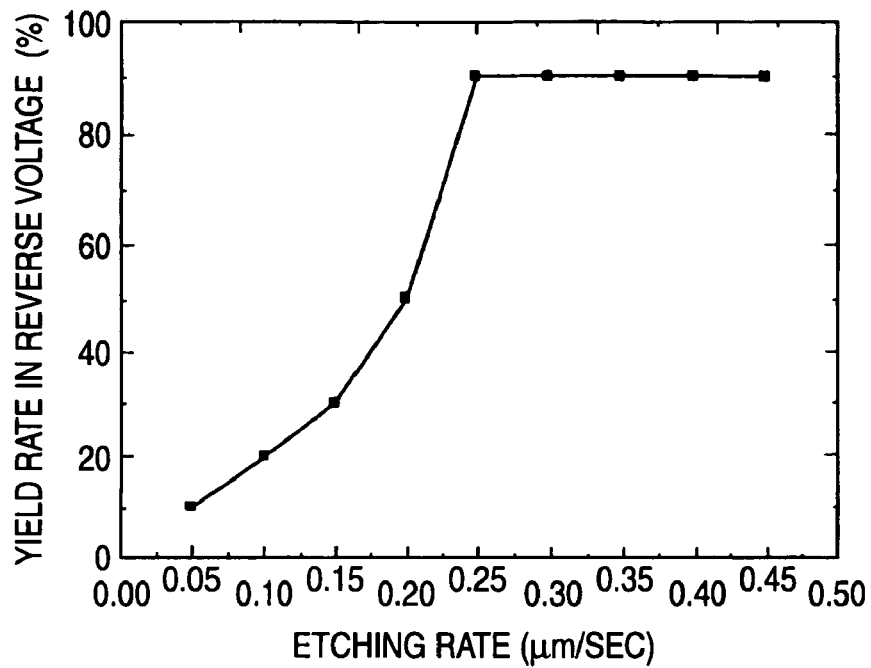
FIG. 14 shows a characteristic view of a yield rate in reverse withstand voltage to an etching rate when stress is removed.

A relationship of a yield rate in reverse withstand voltage against an etching rate when stress was removed by chemical etching was investigated, and a result of investigation is described. FIG. 14 is a characteristic view showing the relationship of a yield rate in reverse withstand voltage against an etching rate. As shown in FIG. 14, when etching treatment is performed in setting of the etching rate of 0.25 to 0.45 μm/sec, a condition of an etched surface is good, and the yield rate in reverse withstand voltage (at rated voltage or more) is 90% or more. On the contrary, when the etching rate is 0.25 μm/sec or less, sharp irregularity appears on the etched surface, therefore the yield rate in reverse voltage is decreased.

On the other hand, when the etching rate is 0.45 μm/sec or more, unevenness appears on the etched surface, and planarity (flatness) of the surface becomes nonuniform, consequently the yield rate is decreased. Therefore, preferably, the etching rate is set to be about 0.45 μm/sec in an initial stage of an etchant, and the etchant is exchanged at a point when the etching rate is decreased to 0.25 μm/sec.

Figure 15:
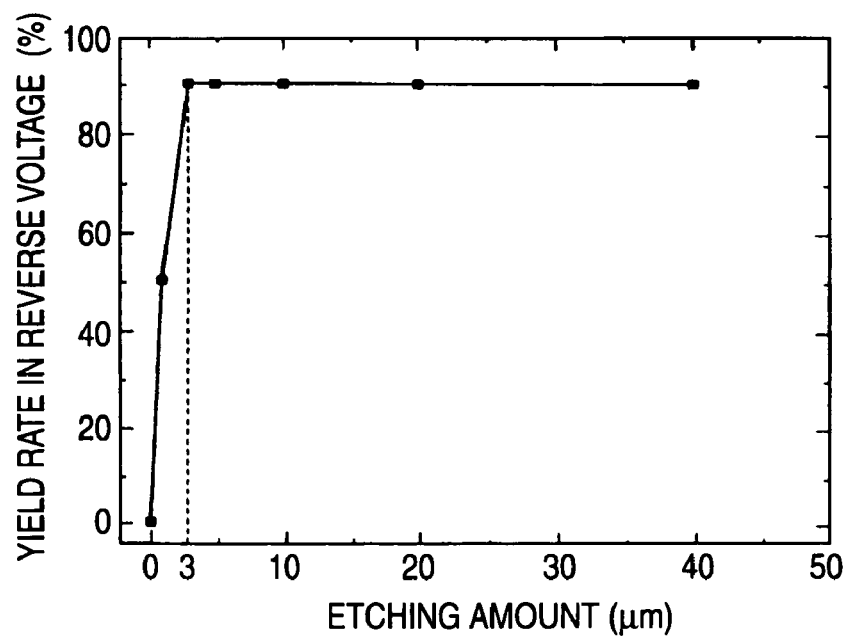
FIG. 15 shows a characteristic view of a yield rate in reverse withstand voltage to an etching amount when stress is removed.

A relationship of a yield rate in reverse withstand voltage against an etching amount when stress was removed by chemical etching was investigated, and a result of investigation is described. FIG. 15 shows a characteristic view showing the relationship of a yield rate in reverse withstand voltage against an etching amount. As shown in FIG. 15, when the etching amount is 3 μm or more, the yield rate in reverse withstand voltage is 90% or more. On the contrary, when the etching amount is less than 3 μm, since a stress layer caused by grinding of the back face of the substrate can not sufficiently removed, the yield rate is decreased. Therefore, when the stress layer caused by the grinding is removed, a ground surface of the back face of the substrate is preferably removed in thickness of 3 to 20 μm.

According to the embodiment 1, when reverse bias voltage is applied to the diode 100, a depletion layer is expanded to the N⁻ drift layer 1, and reaches the N cathode buffer layer 4, however, since it is stopped in the middle of the N cathode buffer layer 4, it does not reach the N⁺ cathode layer 3. Accordingly, flow of a reverse leakage current into the diode 100 can be suppressed. Moreover, the semiconductor substrate is reduced in thickness by grinding, and such a ground surface is subjected to ion implantation and thermal activation of an implanted element, thereby the diode 100 showing a small reverse leakage current can be fabricated.

Embodiment 2

In embodiment 2, the diode 100 shown in FIG. 1 is fabricated in a different procedure from that in the embodiment 1. A configuration of a diode of the embodiment 2 is the same as that of the diode 100 of the embodiment 1 shown in FIG. 1. In the following description, overlapped description with description in the embodiment 1 is omitted.

Figure 16:
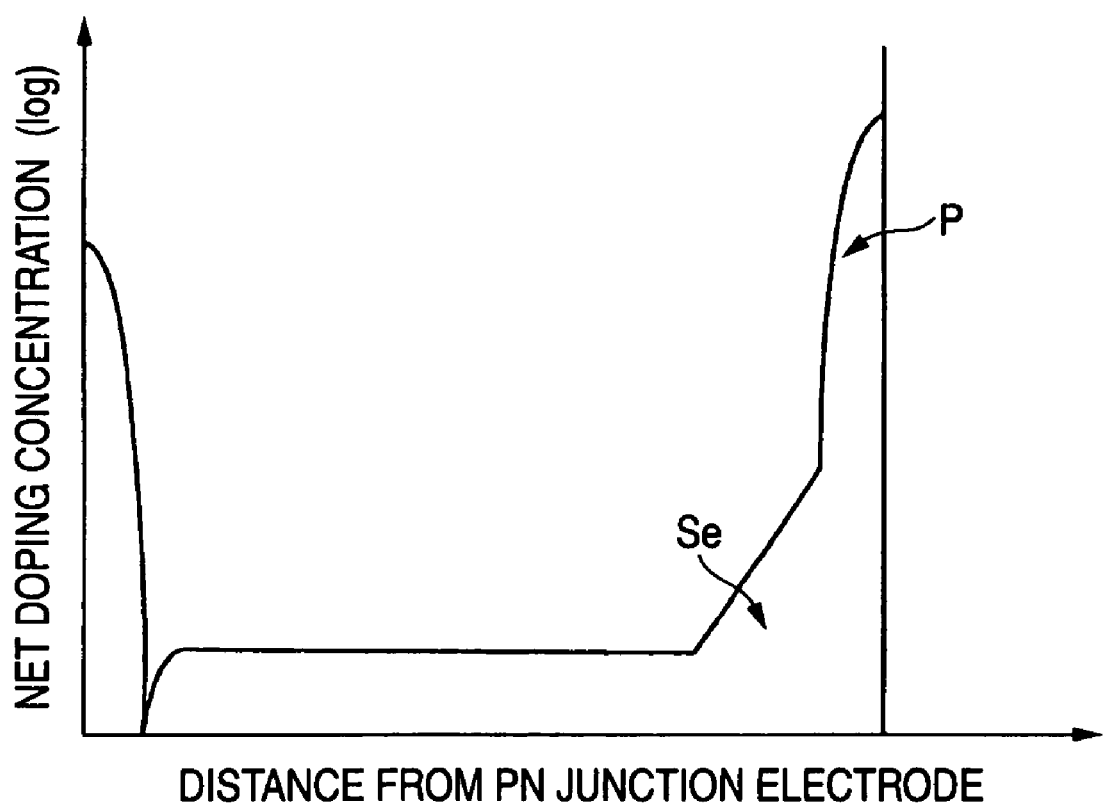
FIG. 16 shows an explanatory view of doping concentration of a semiconductor device according to embodiment 2.

FIG. 16 shows an explanatory view showing an example of doping concentration of the diode of the embodiment 2. As shown in FIG. 16, in the embodiment 2, concentration distribution of the N cathode buffer layer 4 is not uniform unlike the embodiment 1, and for example, gradually reduced from a cathode side to an anode side. The N cathode buffer layer 4 having such concentration distribution is formed by, for example, diffusing selenium (Se) from the cathode side, as described later. In FIG. 16, indication of Se by an arrow means that the relevant portion (N cathode buffer layer 4) has selenium as a dopant. Similarly, a portion indicated as P by an arrow ($N^+$ cathode layer 3) has phosphorous as a dopant.

Figure 17:
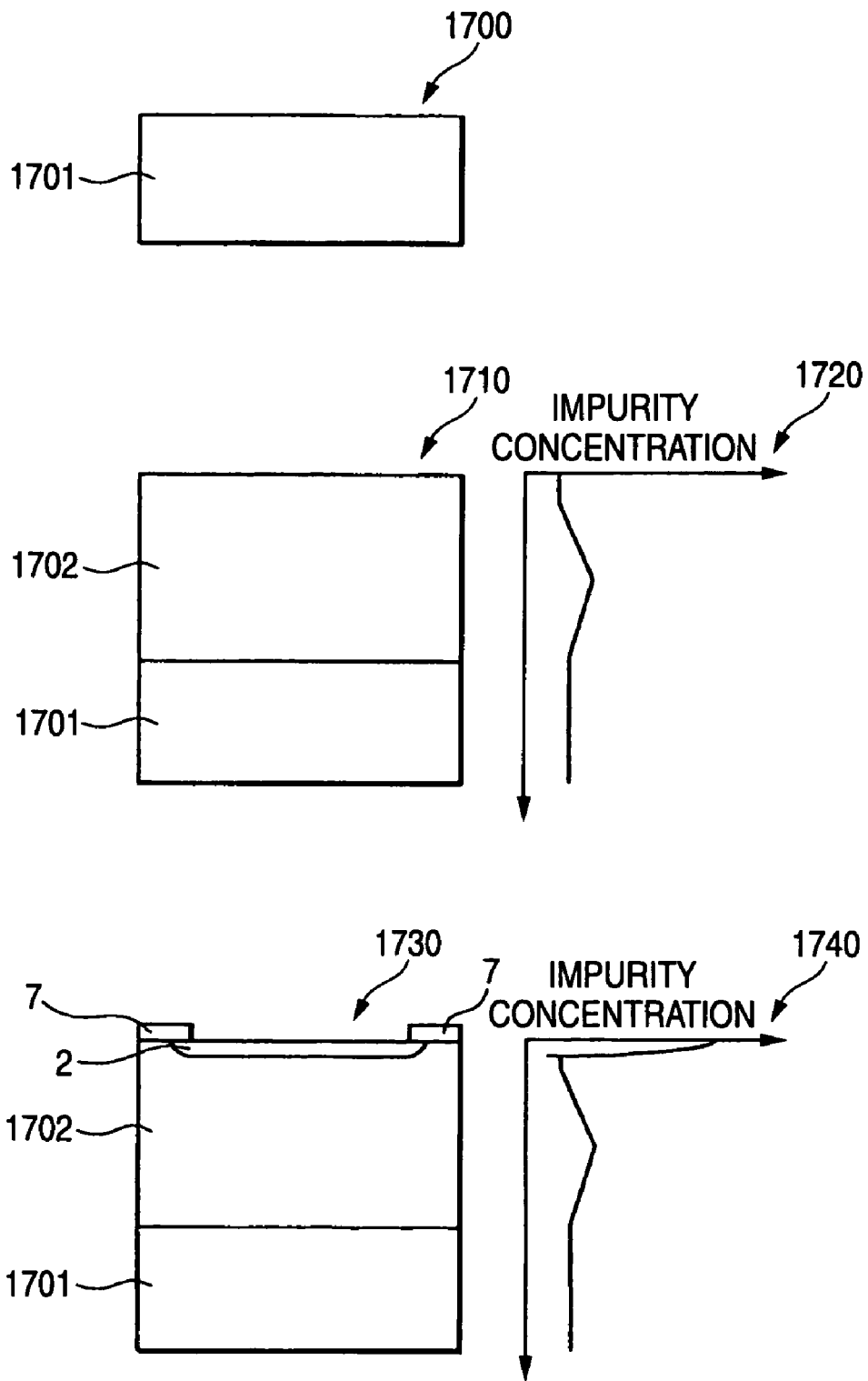
FIG. 17 shows a relevant-part section view of a manufacturing process of the semiconductor device according to the embodiment 2.
Figure 18:
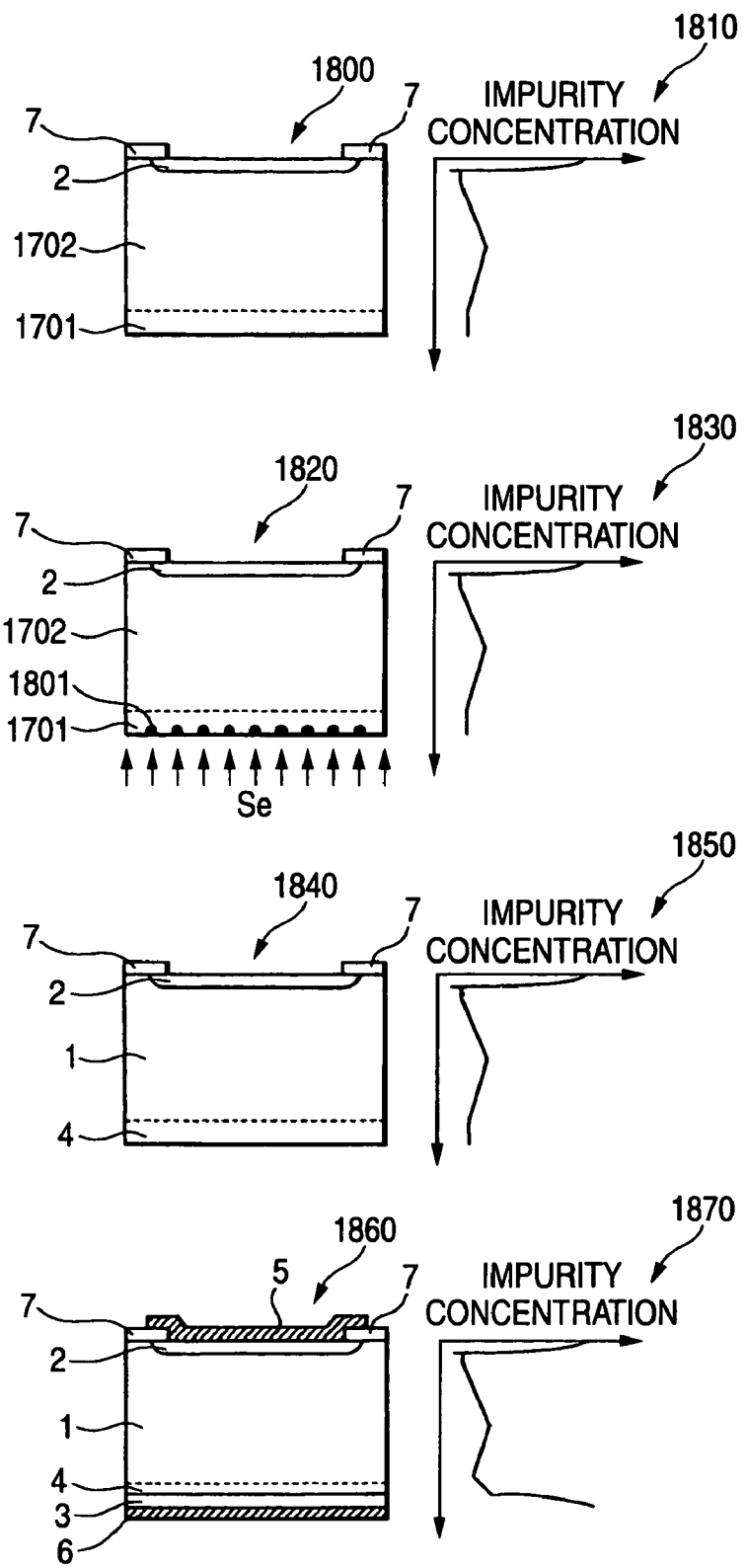
FIG. 18 shows a relevant-part section view of the manufacturing process according to FIG. 17.

FIGS. 17 and 18 show relevant-part section views showing a manufacturing process according to the embodiment 2. First, as shown by a reference 1700 in FIG. 17, an N-type FZ wafer 1701, for example, 5 ins. in diameter is prepared as a starting wafer, the wafer having a concentration of contained phosphorous of $8\times10^{13}$ atoms/cc. Then, as shown by a reference 1710, an N-type epitaxial layer 1702 is grown on a right face side of the N-type FZ wafer 1701. The N-type epitaxial layer 1702 is to be the $N^-$ drift layer 1 of the diode 100. This epitaxial wafer is used for a semiconductor substrate. A reference 1720 indicates a profile of impurity concentration of the semiconductor substrate.

Next, as shown by a reference 1730, steps of a typical diode process are performed, so that the P anode layer 2 and a not-shown guard ring edge structure are formed on a surface of the N-type epitaxial layer 1702. Furthermore, the insulating film 7 is provided on a surface of the P anode layer 2, and then a contact hole is opened in the insulating film 7. A reference 1740 indicates a profile of impurity concentration of the semiconductor substrate in this state.

Then, the semiconductor substrate is irradiated with an electron beam and then subjected to heat treatment. Then, as shown by a reference 1800 in FIG. 18, a surface at a side of the N-type FZ wafer 1701, on which the N-type epitaxial layer 1702 is not stacked, that is, a back face of the substrate is subjected to grinding, so that total thickness of 150 μm is given. Then, such a ground surface is subjected to wet etching using nitro-hydrofluoric acid, so that final thickness of 130 μm is given. In the embodiment 2, the wet etching exposes the $N^-$ drift layer 1. A reference 1810 indicates a profile of impurity concentration of the semiconductor substrate in this state.

Next, as shown by a reference 1820, the back face of the substrate is subjected to ion implantation of selenium in a dose amount of $1\times10^{12}$ atoms/cm$^2$. In a cross section view shown by a reference 1820, circles with a reference 1801 indicate implanted selenium. A reference 1830 indicates a profile of impurity concentration of the semiconductor substrate in this state.

Next, as shown by a reference 1840, heat treatment for 1 hr at 600° C. is performed. Implanted selenium 1801 is thereby diffused from the back face of the substrate to the anode side in depth of about 10 μm. Therefore, thickness of the $N^-$ drift layer 1 and thickness of the N cathode buffer layer 4 in this stage are 120 μm and 10 μm respectively. A reference 1850 indicates a profile of impurity concentration of the semiconductor substrate in this state.

Next, as shown by a reference 1860, the anode electrode 5 including Al-1% Si is formed on a surface of the P anode layer 2. Then, the back face of the substrate is ion-implanted with phosphorous at an acceleration voltage of 45 keV and in a dose amount of $1\times10^{15}$ atoms/cm$^2$. Then, such an ion implanted surface is irradiated with YAG second harmonic laser in energy density of 4 J/cm$^2$, so that the implanted phosphorous is activated to form the $N^+$ cathode layer 3.

Finally, metals are deposited on a surface of the $N^+$ cathode layer 3 in order of Ti, Ni and Au to form the cathode electrode 6, consequently the diode 100 is completed. A reference 1870 indicates a profile of impurity concentration of the completed diode 100.

According to the embodiment 2, since the N cathode buffer layer 4 is introduced with a dopant by the ion implantation method, concentration of the N cathode buffer layer 4 can be accurately controlled. While the dopant in the N cathode buffer layer 4 is desirably selenium because it has a high diffusion coefficient at 1000° C., $3\times10^{-11}$ cm$^2$/sec, and therefore diffuses about 10 μm, phosphorous may be used as the dopant instead of selenium.

In such a case, phosphorous can be ion-implanted at an acceleration voltage of 720 keV and in a dose amount of $1\times10^{12}$ atoms/cm$^2$. By doing this, a trajectory of phosphorous of 0.8 μm, depth of concentration distribution of about 1.0 μm, and peak concentration of distribution of about $3\times10^{16}$ atoms/cc are given. Since an integral value of impurity concentration of the N-type cathode buffer layer 4 is $1.5\times10^{12}$ atoms/cc at that time, the N cathode buffer layer 4 can sufficiently stop a depletion layer during reverse biasing.

Embodiment 3

In embodiment 3, the diode 100 shown in FIG. 1 is fabricated in a different procedure from that in the embodiment 1. A configuration of a diode of the embodiment 3 is the same as that of the diode 100 of the embodiment 1 shown in FIG. 1. In the following description, overlapped description with description in the example 1 is omitted.

Figure 19:
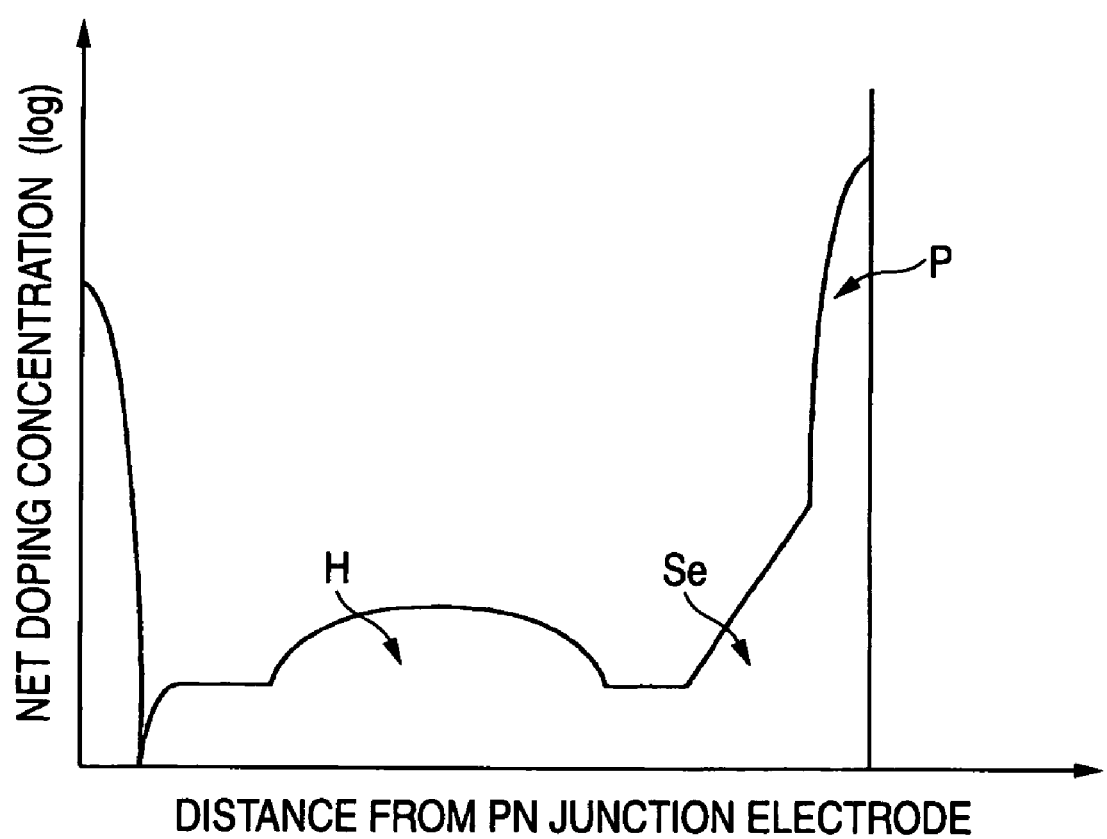
FIG. 19 shows an explanatory view of doping concentration of a semiconductor device according to embodiment 3.

FIG. 19 shows an explanatory view showing an example of doping concentration of the diode of the embodiment 3. As shown in FIG. 19, in the embodiment 3, concentration distribution of the N cathode buffer layer 4 is gradually reduced, for example, from a cathode side to an anode side, as the embodiment 2. Moreover, a broad buffer layer is formed in the $N^-$ drift layer 1, the buffer layer having impurity concentration being reduced with approaching an anode side and a cathode side from the center of the drift layer 1. Such a broad buffer layer and an effect of the layer are as disclosed in the JP-A-2003-318412.

In FIG. 19, indication of Se by an arrow means that the relevant portion (N cathode buffer layer 4) has selenium as a dopant. Similarly, a portion indicated as P by an arrow ($N^+$ cathode layer 3) has phosphorous as a dopant. Moreover, a portion indicated as H by an arrow (broad buffer layer) has a light ion such as proton as a dopant.

Figure 20:
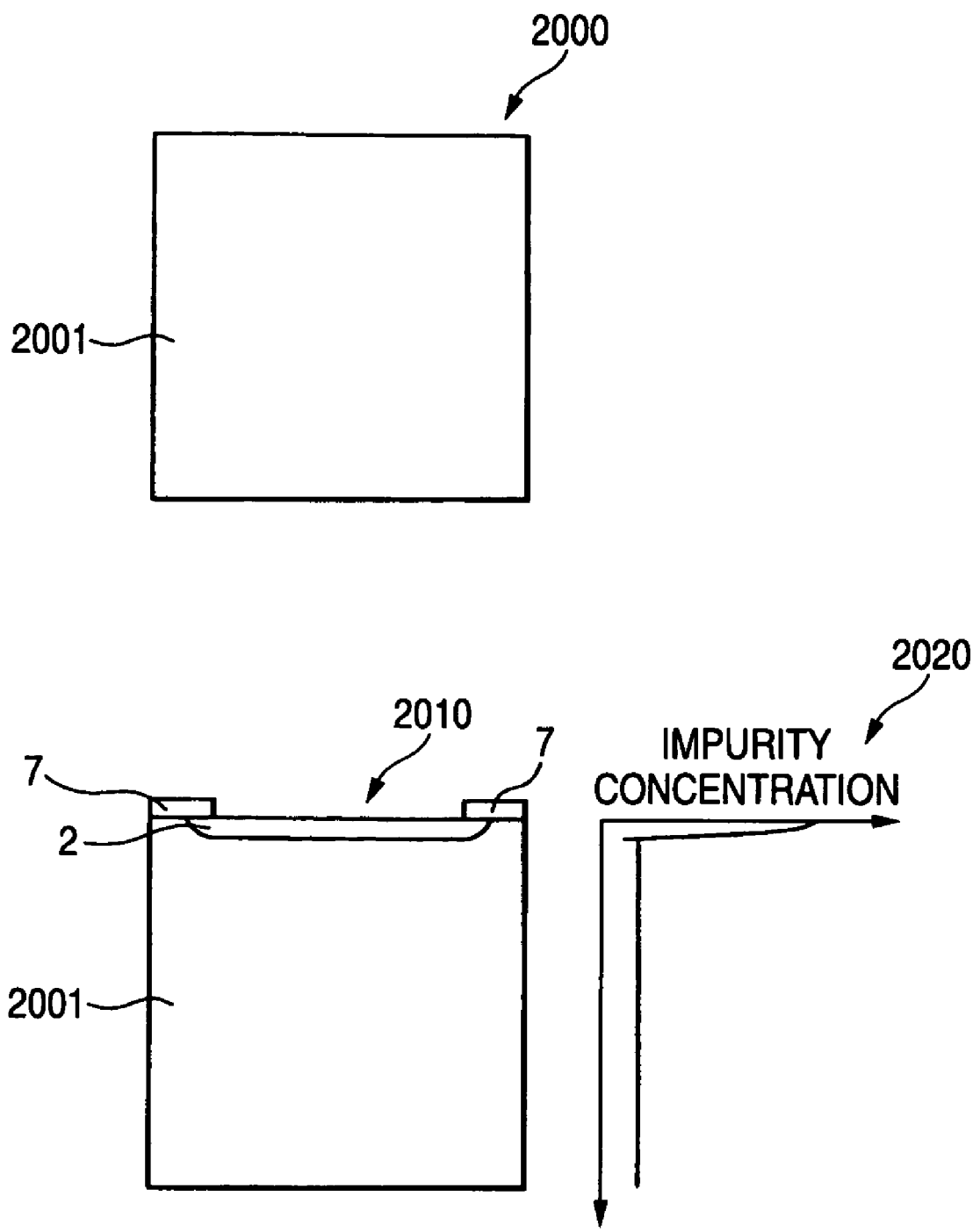
FIG. 20 shows a relevant-part section view of a manufacturing process of the semiconductor device according to embodiment 3.
Figure 21:
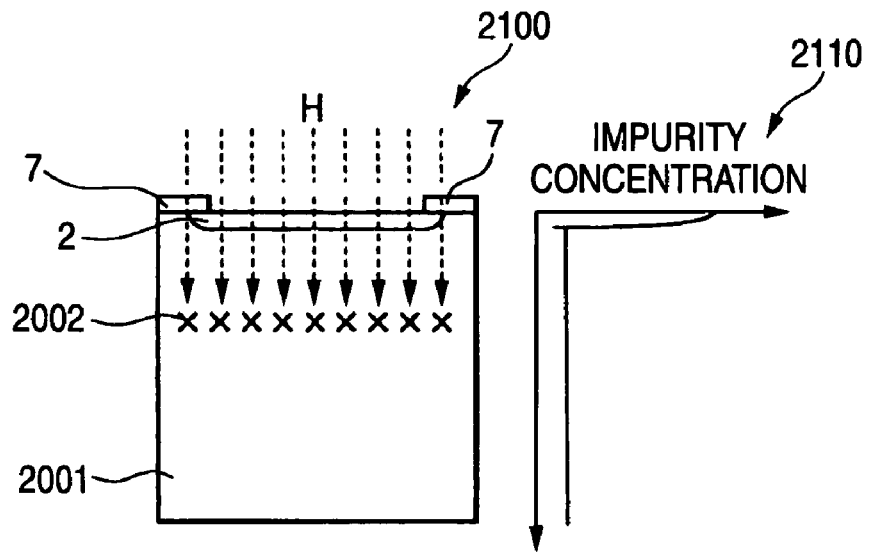
FIG. 21 shows a relevant-part section view of the manufacturing process according to FIG. 20.
Figure 21:
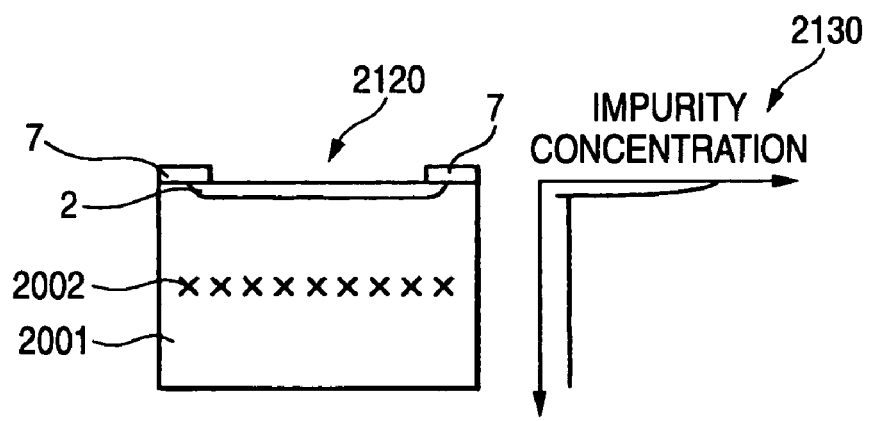
Figure 21:
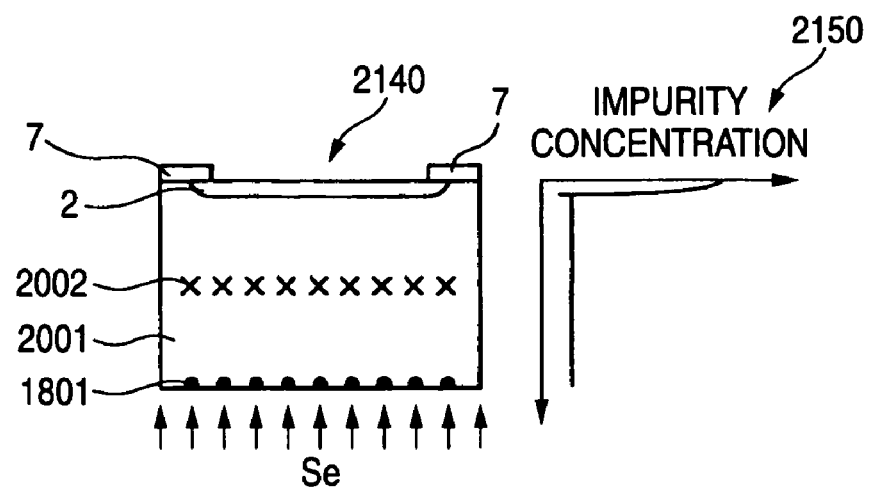
Figure 22:
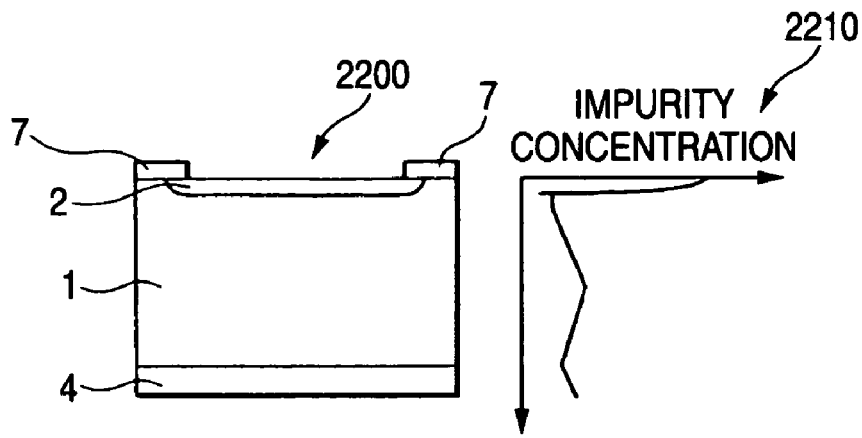
FIG. 22 shows a relevant-part section view of the manufacturing process according to FIG. 21.
Figure 22:
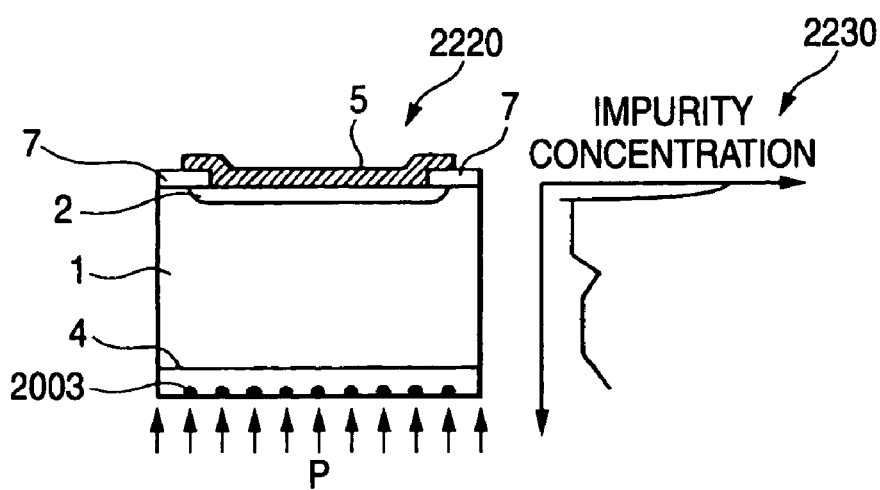
Figure 22:
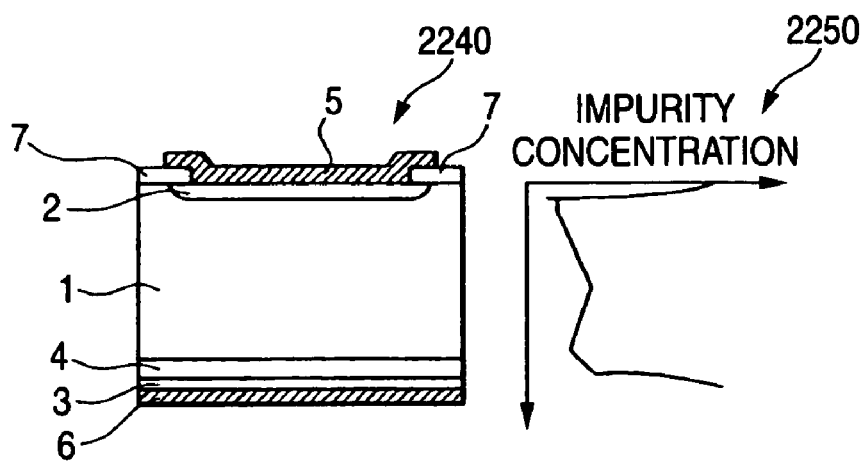

FIGS. 20 to 22 show relevant-part section views showing a manufacturing process according to embodiment 3. First, as shown by a reference 2000 in FIG. 20, an N-type FZ wafer 2001, for example, 5 ins. in diameter is prepared as a starting wafer, the wafer having a concentration of contained phosphorous of $5\times10^{13}$ atoms/cc. Then, as shown by reference 2010, steps of a typical diode process are performed, so that the P anode layer 2 and a not-shown guard ring edge structure are formed on a surface of a right face of the N-type FZ wafer 2001. Furthermore, the insulating film 7 is provided on a surface of the P anode layer 2, and then a contact hole is opened in the insulating film 7. A reference 2020 indicates a profile of impurity concentration of the semiconductor substrate in this state.

Next, as shown by a reference 2100 in FIG. 21, protons are irradiated from a side of the P anode layer 2 in a dose amount of $2\times10^{11}$ atoms/cm$^2$. In a cross section view shown by a reference 2100, crosses with a reference 2002 indicate protons introduced into the N-type FZ wafer 2001. Reference 2110 indicates a profile of impurity concentration of the semiconductor substrate in this state.

Next, as shown by reference 2120, a surface at a side of the N-type FZ wafer 2001, on which the P anode layer 2 is not formed, that is, a back face of the substrate is subjected to grinding, so that total thickness of 150 µm is given. Then, such a ground surface is subjected to wet etching using nitrohydrofluoric acid, so that final thickness of 130 µm is given. A reference 2130 indicates a profile of impurity concentration of the semiconductor substrate in this state.

Next, as shown by a reference 2140, the back face of the substrate is subjected to ion implantation of selenium 1801 in a dose amount of $1 \times 10^{12}$ atoms/cm$^2$. A reference 2150 indicates a profile of impurity concentration of the semiconductor substrate in this state.

Next, as shown by a reference 2200 in FIG. 22, heat treatment for 1 hr at 600° C. is performed. Implanted selenium 1801 is thereby diffused from the back face of the substrate to the anode side in depth of about 10 µm. Moreover, the protons introduced into the N-type FZ wafer 2001 are formed into donors, consequently the broad buffer layer is formed. Therefore, in this stage, thickness of the broad buffer layer to be the N$^-$ drift layer 1 is 120 µm, and thickness of the N cathode buffer layer 4 is 10 µm. A reference 2210 indicates a profile of impurity concentration of the semiconductor substrate in this state.

Next, as shown by a reference 2220, the anode electrode 5 including Al-1% Si is formed on a surface of the P anode layer 2. Then, the back face of the substrate is ion-implanted with phosphorous at an acceleration voltage of 45 keV and in a dose amount of $1 \times 10^{15}$ atoms/cm$^2$. In a cross section view shown by a reference 2220, circles with a reference 2003 indicate implanted phosphorous. A reference 2230 indicates a profile of impurity concentration of the semiconductor substrate in this state.

Next, as shown by a reference 2240, an ion implantation surface is irradiated with YAG second harmonic laser in energy density of 4 J/cm$^2$, so that the implanted phosphorous 2003 is activated to form the N$^+$ cathode layer 3. Finally, metals are deposited on a surface of the N$^+$ cathode layer 3 in order of Ti, Ni and Au to form the cathode electrode 6, consequently the diode 100 is completed. A reference 2250 indicates a profile of impurity concentration of the completed diode 100.

According to the embodiment 3, since the N cathode buffer layer 4 is introduced with a dopant by the ion implantation method, concentration of the N cathode buffer layer 4 can be accurately controlled. Moreover, the broad buffer layer can be formed without epitaxial growth. Phosphorous may be used as a dopant of the N cathode buffer layer 4 as the embodiment 2.

While an example of using an embodiment of the invention for a diode was described in the embodiments 1 to 3, an embodiment of the invention can be used for IGBT. For example, when the embodiment 3 is used for FS-IGBT (field stop IGBT), turnoff with oscillation being suppressed can be realized in addition to low loss.

This is because a space-charge region is expanded from a PN junction at a right face side of an element to a back face side in turnoff, however, a broadbuffer structure is used, thereby electric field strength is temporarily decreased in the middle of the N$^-$ drift layer so that expansion of the space-charge region can be suppressed, as reverse recovery of a diode. As a result, since carriers are remained at the back face side, and thus not depleted, steep increase in turnoff surge voltage can be suppressed.

A typical manufacturing process of NPT-IGBT (Non Punch Through IGBT) or FS-IGBT has a step that an FZ bulk wafer is ground to have thickness of about 100 µm, then such a ground surface is subjected to ion implantation and heat treatment. Therefore, the manufacturing process of the embodiment 3 is applied to such a manufacturing process, thereby IGBT having a broad buffer structure can be easily fabricated. Accordingly, overvoltage breakdown or occurrence of an EMI noise can be suppressed in a power conversion device such as a PWM inverter using an IGBT module.

Figure 23:
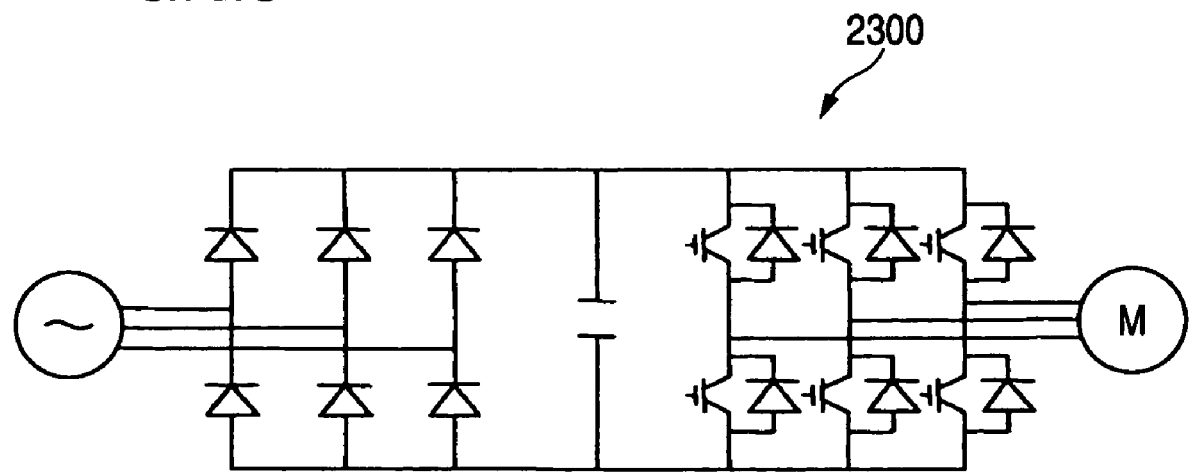
FIG. 23 shows a circuit diagram of an AC-AC inverter/converter.
Figure 24:
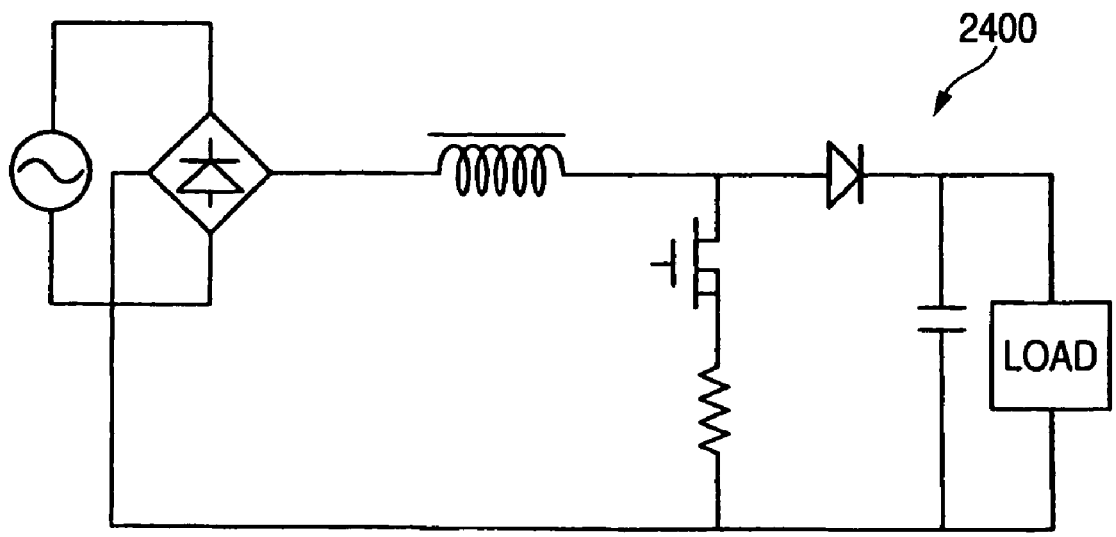
FIG. 24 shows a circuit diagram of a power factor improvement circuit.

FIGS. 23 and 24 show diagrams showing application examples of the embodiments 1 to 3 to a diode or FS (Field Stop)—IGBT. An AC-AC inverter/converter 2300 shown in FIG. 23 can efficiently control an induction motor or a servo motor, and widely used in industry or electric railways. A power factor improvement circuit (PFC circuit) 2400 shown in FIG. 24 is a circuit for improving a waveform of an input current for AC-AC conversion by controlling the current to be in a sign wave form, and used for a switching power source.

As described hereinbefore, according to the respective embodiments, reverse recovery time and loss are significantly decreased compared with former cases, and a diode having an improved soft-recovery characteristic can be fabricated in a high production yield. Moreover, an IGBT module or IPM (Intelligent Power Module) can be realized, which is low in electric loss and radiation electromagnetic noise, and formed on the basis of the environmental issue.

The scope of the invention is not limited to the above embodiments, and can be variously altered or modified. For example, values of size and concentration described in the embodiments are an example, and the scope of the invention is not limited to these values. Moreover, while it was assumed in each embodiment that the first conduction type was the N type, and the second conduction type was the P type, if it is assumed that the first conduction type is the P type, and the second conduction type is the N type, another preferred embodiment of the invention is similarly realized.

The semiconductor devices as described above, and the corresponding methods of manufacturing therefor are useful for power semiconductor devices, and particularly suitable for high speed and low loss diodes or IGBTs having a soft recovery characteristic.

What is claimed is:

1. A semiconductor device comprising:
   a first semiconductor layer of a first conduction type, having a first main surface and a second main surface opposed to the first main surface,
   a second semiconductor layer of a second conduction type, which is high in concentration compared with the first semiconductor layer and provided in contact with the first semiconductor layer at a side of the first main surface of the first semiconductor layer,
   a third semiconductor layer of the first conduction type, which is high in concentration compared with the first semiconductor layer and provided at a side of the second main surface of the first semiconductor layer,
   a fourth semiconductor layer of the first conduction type, which is high in concentration compared with the first semiconductor layer and low in concentration compared with the third semiconductor layer, and provided in contact with both the first semiconductor layer and the third semiconductor layer between the first semiconductor layer and the third semiconductor layer, a first electrode electrically connected to the second semiconductor layer, and a second electrode electrically connected to the third semiconductor layer, wherein a thickness of the fourth semiconductor layer in a direction from the first main surface to the second main surface of the first semiconductor layer is large compared with a thickness of the third semiconductor layer in the same direction, an impurity concentration of the fourth semiconductor layer is in the range from $1\times10^{14}$ atoms/cc to $1\times10^{15}$ atoms/cc, and at a position located in the fourth semiconductor layer, an integral value of the impurity concentration is equal to $n_c$, the integral value obtained by integrating the impurity concentration from a boundary of the first semiconductor layer with the second semiconductor layer to the second main surface, where:

$n_c = \in_s \cdot E_c / q,$ $\in_s$ is a dielectric constant of a semiconductor, q is an elementary charge, and $E_c$ is a dielectric breakdown field strength of the semiconductor.

2. The semiconductor device according to claim 1 wherein:
the thickness of the fourth semiconductor layer in the direction from the first main surface to the second main surface of the first semiconductor layer is at least 0.1 μm.

3. The semiconductor device according to claim 1 wherein:
the thickness of the fourth semiconductor layer in the direction from the first main surface to the second main surface of the first semiconductor layer is in the range from 0.1 μm to 20 μm.

4. A semiconductor device comprising:
a first semiconductor layer of a first conduction type including an FZ semiconductor substrate, having a first main surface and a second main surface opposed to the first main surface, a second semiconductor layer of a second conduction type, which is high in concentration compared with the first semiconductor layer and provided in contact with the first semiconductor layer at a side of the first main surface of the first semiconductor layer, a third semiconductor layer of the first conduction type formed in a surface by a diffusion process, the surface being formed by decreasing thickness of the second main surface of the first semiconductor layer by grinding, and a fourth semiconductor layer of the first conduction type, the third semiconductor layer being high in concentration compared with the first semiconductor layer, and the fourth semiconductor layer being situated between the first semiconductor layer and the third semiconductor layer, and high in concentration compared with the first semiconductor layer and low in concentration compared with the third semiconductor layer, and the semiconductor device further comprising, a first electrode electrically connected to the second semiconductor layer, and a second electrode electrically connected to the third semiconductor layer, wherein a thickness of the fourth semiconductor layer in a direction from the first main surface to the second main surface of the first semiconductor layer is large compared with a thickness of the third semiconductor layer in the same direction, an impurity concentration of the fourth semiconductor layer is in the range from $1\times10^{14}$ atoms/cc to $1\times10^{15}$ atoms/cc, and at a position located in the fourth semiconductor layer, an integral value of the impurity concentration is equal to $n_c$, the integral value obtained by integrating the impurity concentration from a boundary of the first semiconductor layer with the second semiconductor layer to the second main surface, where:

$n_c = \in_s \cdot E_c / q,$ $\in_s$ is a dielectric constant of a semiconductor, q is an elementary charge, and $E_c$ is a dielectric breakdown field strength of the semiconductor.

5. The semiconductor device according to claim 4 wherein:
the thickness of the fourth semiconductor layer in the direction from the first main surface to the second main surface of the first semiconductor layer is at least 0.1 μm.

6. The semiconductor device according to claim 4 wherein:
the thickness of the fourth semiconductor layer in the direction from the first main surface to the second main surface of the first semiconductor layer is in the range from 0.1 μm to 20 μm.

7. A semiconductor device comprising:
a fourth semiconductor layer of a first conduction type including an FZ semiconductor substrate or a CZ semiconductor substrate, having a first main surface and a second main surface opposed to the first main surface, a first semiconductor layer of the first conduction type, having a first main surface and a second main surface opposed to the first main surface, which is low in concentration compared with the fourth semiconductor layer and formed at a side of a first main surface of the fourth semiconductor layer by epitaxial growth, a second semiconductor layer of a second conduction type, which is high in concentration compared with the first semiconductor layer and provided in contact with the first semiconductor layer at a side of the second main surface of the first semiconductor layer, a third semiconductor layer of the first conduction type formed in a surface by a diffusion process, the surface being formed by decreasing thickness of the second main surface of the fourth semiconductor layer, the third semiconductor layer being high in concentration compared with the fourth semiconductor layer, and the fourth semiconductor layer being situated between the first semiconductor layer and the third semiconductor layer, and the semiconductor device further comprising, a first electrode electrically connected to the second semiconductor layer, and a second electrode electrically connected to the third semiconductor layer, wherein a thickness of the fourth semiconductor layer in a direction from the first main surface to the second main surface of the first semiconductor layer is large compared with a thickness of the third semiconductor layer in the same direction, an impurity concentration of the fourth semiconductor layer is in the range from $1\times10^{14}$ atoms/cc to $1\times10^{15}$ atoms/cc, and at a position located in the fourth semiconductor layer, an integral value of the impurity concentration is equal to $n_c$, the integral value obtained by integrating the impurity concentration from a boundary of the first semiconductor layer with the second semiconductor layer to the second main surface, where:

$n_c = \epsilon_s \cdot E_c / q$, $\epsilon_s$ is a dielectric constant of a semiconductor,
q is an elementary charge, and
$E_c$ is a dielectric breakdown field strength of the semiconductor.

8. The semiconductor device according to claim 7 wherein: the thickness of the fourth semiconductor layer in the direction from the first main surface to the second main surface of the first semiconductor layer is at least 0.1 μm.

9. The semiconductor device according to claim 7 wherein: the thickness of the fourth semiconductor layer in the direction from the first main surface to the second main surface of the first semiconductor layer is in the range from 0.1 μm to 20 μm.

* * * * *